(12) United States Patent
Ku et al.

(10) Patent No.: US 10,906,652 B2
(45) Date of Patent: Feb. 2, 2021

(54) THERMAL MANAGEMENT SYSTEMS FOR UNMANNED AERIAL VEHICLES

(71) Applicant: Intel Corporation, Santa Clara, CA (US)

(72) Inventors: Jeff Ku, Taipei (TW); Gavin Sung, New Taipei (TW); Michael Chih-Huei Wang, Bellevue, WA (US); Vincent Hung, New Taipei (TW); Jason Y. Jiang, Taipei (TW)

(73) Assignee: INTEL CORPORATION, Santa Clara, CA (US)

( * ) Notice: Subject to any disclaimer, the term of this patent is extended or adjusted under 35 U.S.C. 154(b) by 824 days.

(21) Appl. No.: 15/663,433

(22) Filed: Jul. 28, 2017

(65) Prior Publication Data
US 2019/0033932 A1 Jan. 31, 2019

(51) Int. Cl.
*B64D 13/00* (2006.01)
*G06F 1/20* (2006.01)
*H05K 7/20* (2006.01)
*B64C 39/02* (2006.01)

(52) U.S. Cl.
CPC ........... *B64D 13/006* (2013.01); *G06F 1/203* (2013.01); *G06F 1/206* (2013.01); *H05K 7/20145* (2013.01); *B64C 39/024* (2013.01)

(58) Field of Classification Search
CPC ................ B64D 13/006; B64C 39/024; B64C 2201/027; B64C 2201/00; B64C 1/38; F28D 2021/0021
See application file for complete search history.

(56) References Cited

U.S. PATENT DOCUMENTS

| 6,575,402 | B1 * | 6/2003 | Scott ..................... B64C 27/20 244/12.2 |
| 9,429,076 | B2 * | 8/2016 | Smith .................... B64D 15/04 |
| 10,669,037 | B1 * | 6/2020 | Kwon ................... B64D 33/08 |
| 2016/0152345 | A1 * | 6/2016 | Molnar .................. B64D 47/06 244/39 |

(Continued)

FOREIGN PATENT DOCUMENTS

| CN | 108702855 A | * | 10/2018 | ......... H05K 7/20336 |
| EP | 2147859 A2 | * | 1/2010 | ........... B64D 13/006 |
| JP | 2017081544 A | * | 5/2017 | ........... B64C 39/064 |

*Primary Examiner* — Benjamin P Lee
(74) *Attorney, Agent, or Firm* — Hanley, Flight & Zimmerman, LLC

(57) ABSTRACT

Thermal management system for unmanned aerial vehicles are disclosed. An example housing for an unmanned aerial vehicle includes a central portion defining a cavity. The housing also includes a first arm to support a first propeller. The first arm has a first proximal end coupled to the central portion and a first distal end spaced from the central portion. The first distal end defines an inlet. The first arm defines a first fluid path in communication with the inlet and the central cavity. The housing also includes a second arm to support a second propeller. The second arm has a second proximal end coupled to the central portion and a second distal end spaced from the central portion. The second distal end defines an outlet. The second arm defines a second fluid path in communication with the outlet and the central cavity. The inlet and outlet are in fluid communication via the first path, the central cavity and the second path.

23 Claims, 21 Drawing Sheets

(56) References Cited

U.S. PATENT DOCUMENTS

| | | | |
|---|---|---|---|
| 2017/0113798 A1* | 4/2017 | Lee | B64C 39/024 |
| 2017/0197701 A1* | 7/2017 | Gielda | B64G 1/58 |
| 2017/0240291 A1* | 8/2017 | Kim | H01M 16/006 |
| 2018/0170553 A1* | 6/2018 | Wang | B64D 13/006 |
| 2018/0259429 A1* | 9/2018 | Adams | B64C 39/024 |
| 2019/0047699 A1* | 2/2019 | Bonden | H01L 23/34 |
| 2019/0300171 A1* | 10/2019 | Morita | B64C 39/02 |
| 2020/0191094 A1* | 6/2020 | Mou | B64D 27/24 |

\* cited by examiner

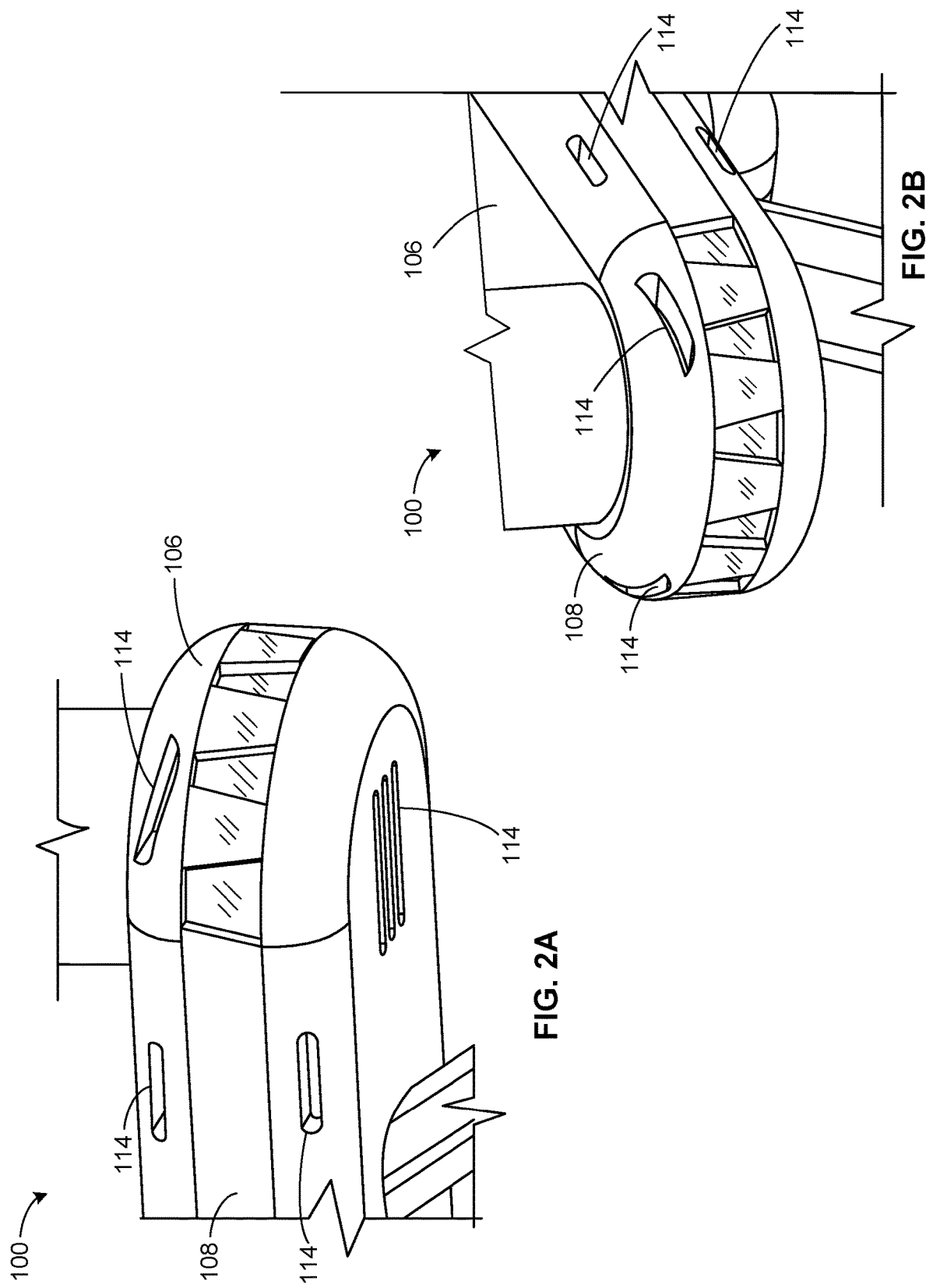

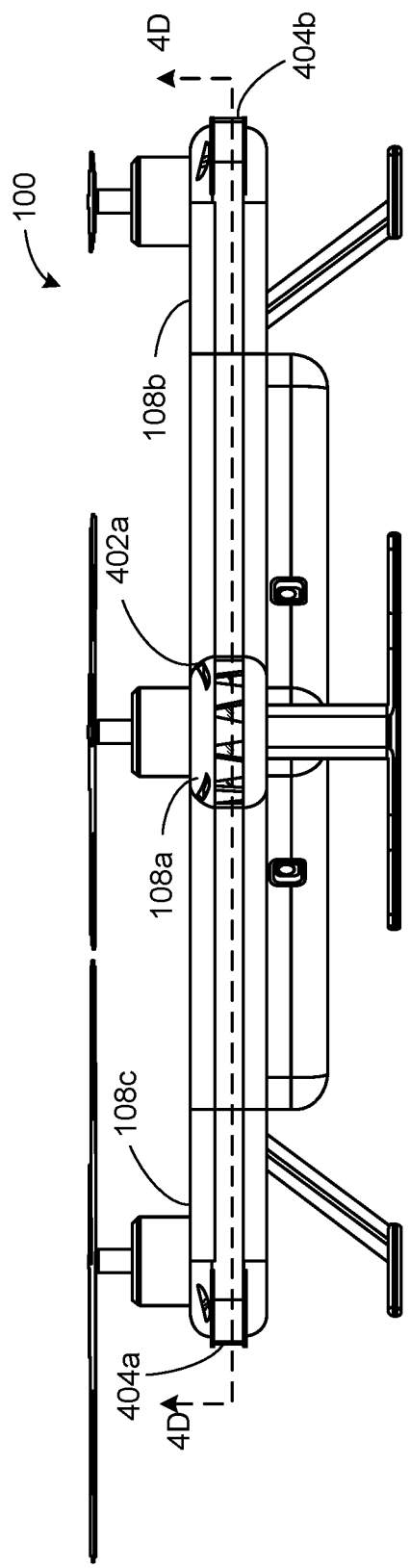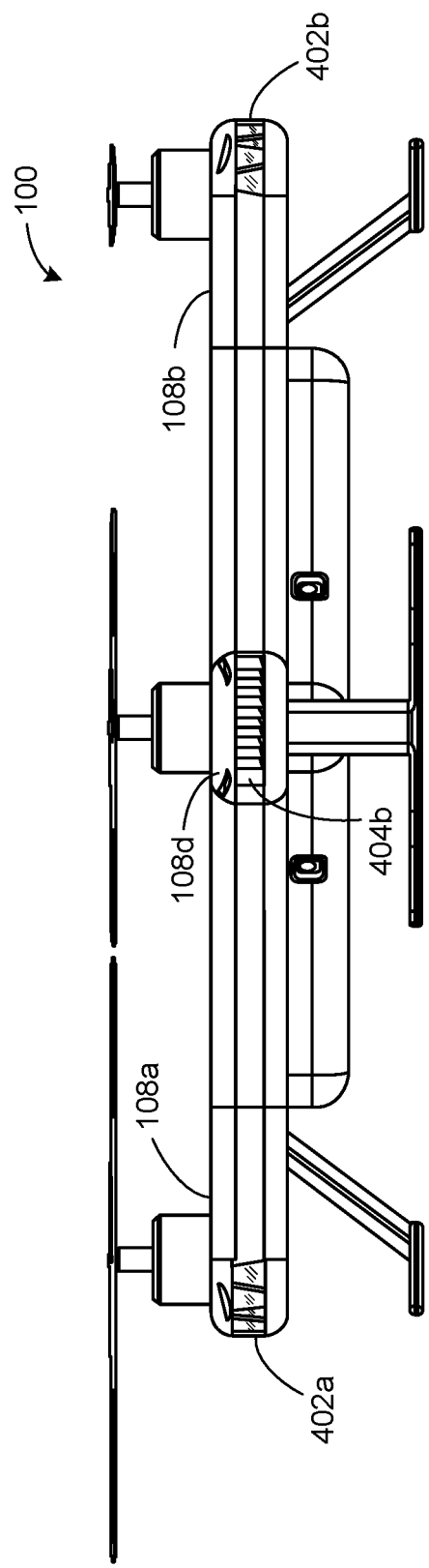

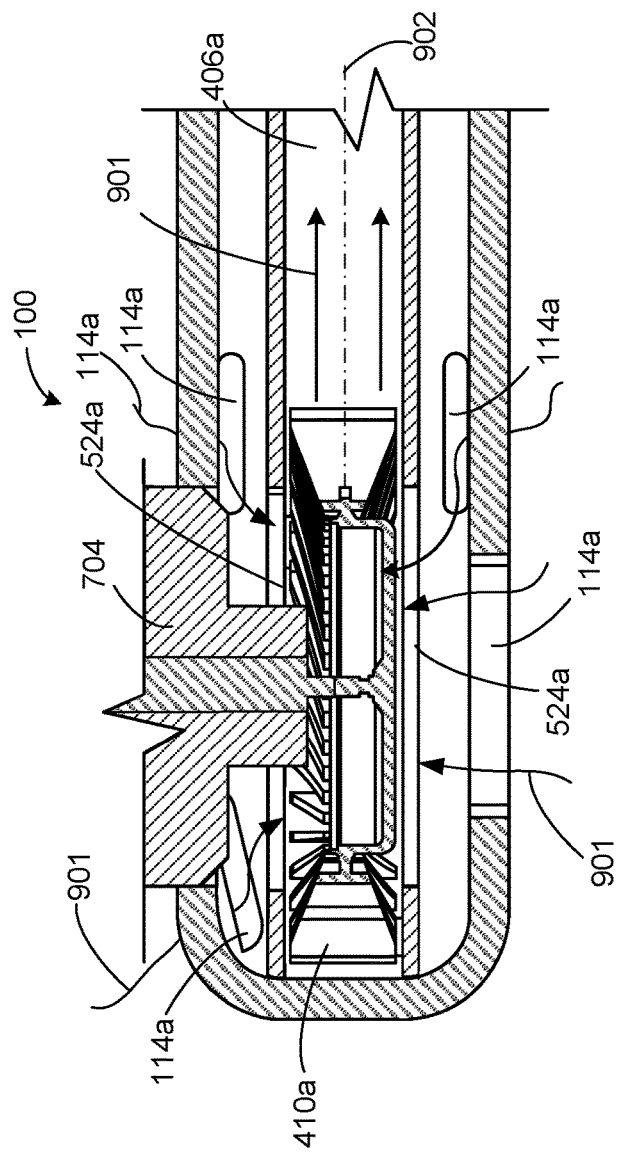
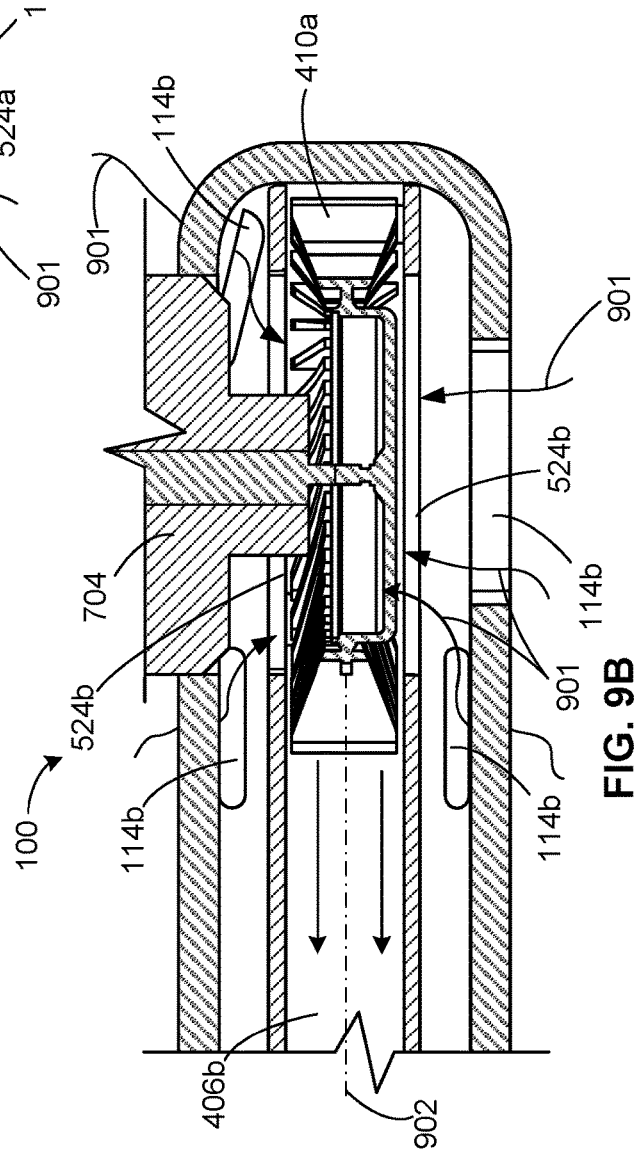
FIG. 9A
FIG. 9B

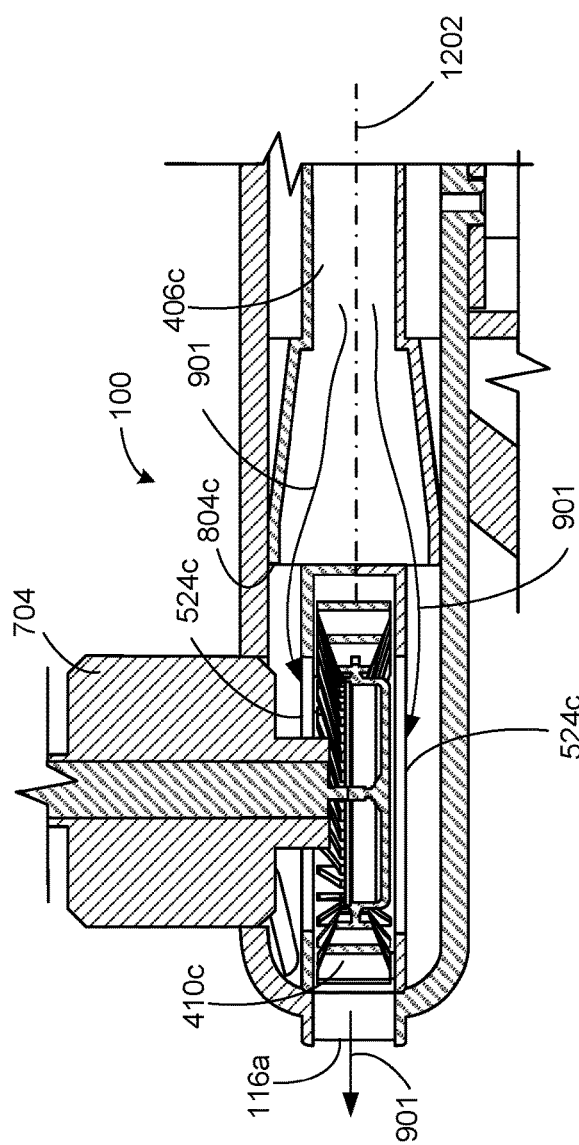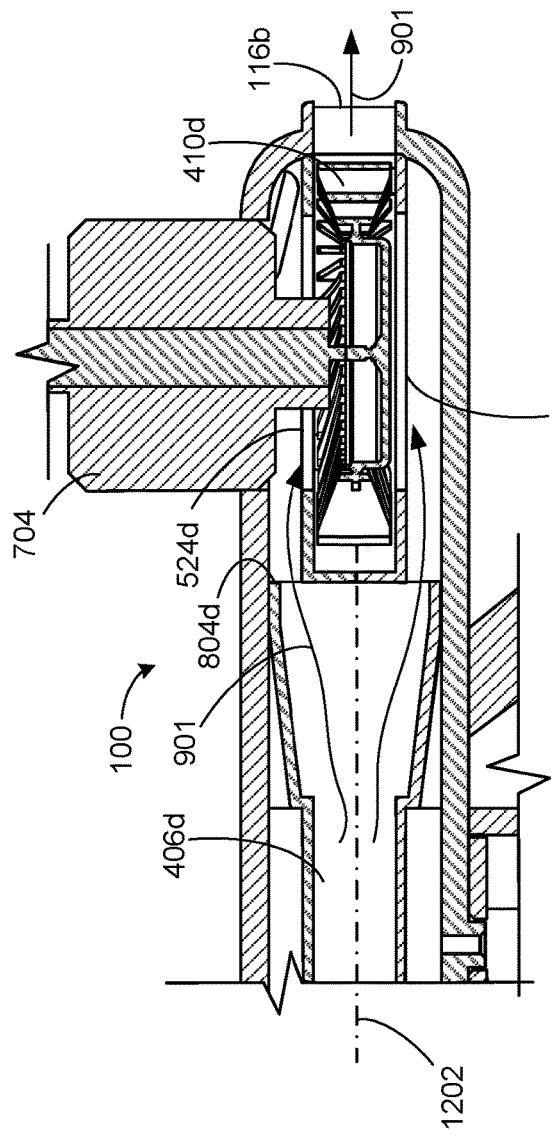

US 10,906,652 B2

THERMAL MANAGEMENT SYSTEMS FOR UNMANNED AERIAL VEHICLES

FIELD OF THE DISCLOSURE

This disclosure relates generally to unmanned aerial vehicles, and, more particularly, to thermal management systems for unmanned aerial vehicles.

BACKGROUND

Over the years, UAVs or drones have become increasingly sophisticated. For example, to enable self-piloted UAVs, the UAVs employ high computing power systems to maneuver to a destination without user input. However, high computing power systems can generate significant amount of heat.

BRIEF DESCRIPTION OF THE DRAWINGS

FIGS. 2A and 2B are respectively bottom and top perspective views of an example inlet of the example UAV of FIGS. 1A and 1B.

FIG. 4B is a front view of the example UAV of FIGS. 1A and 1B taken along line 4B-4B of FIG. 4A.

FIG. 4C is a side view of the example UAV of FIGS. 1A and 1B taken along line 4C-4C of FIG. 4A.

FIGS. 9A, 9B and 10 are partial, enlarged cross-sectional views of the example UAV of FIG. 8A.

FIGS. 11, 12A and 12B are partial, enlarged cross-sectional views of the example UAV of FIG. 8B.

Figure 1A:
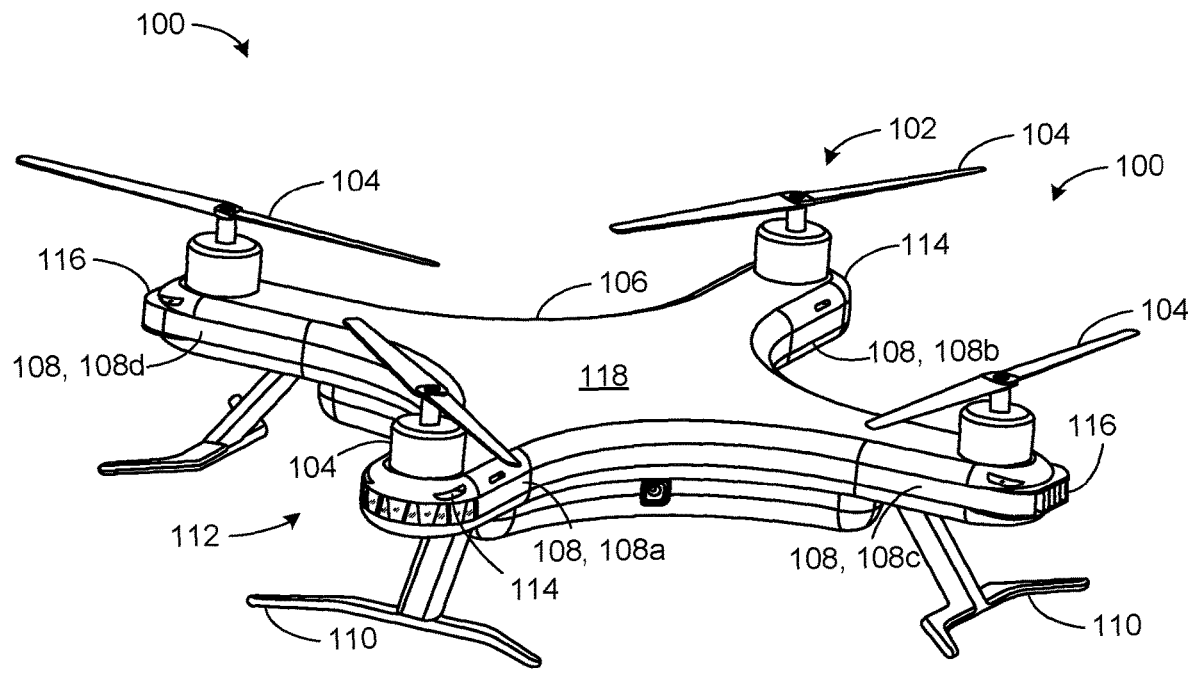
FIG. 1A is a top perspective view of an example UAV constructed in accordance with the teachings of this disclosure.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts. Stating that a part is coupled or connected to another part indicates that the parts are jointed directly or through one or more intervening parts. Thus, physical contact is not required for two parts to be coupled or connected.

DETAILED DESCRIPTION

UAVs employ high-performance electronic device(s) or component(s) (e.g., a system on a chip (SoC), a microprocessor, etc.) that is housed in a frame of the UAVs. High computing power systems (e.g., electronic components) generate a significant amount of heat. Failure to dissipate heat generated by the high computing devices and/or the electronic components may degrade performance characteristic(s) of the electronic device(s), and/or components thereby affecting operating performance or condition of the UAVs they control. In some instances, excessive heat may cause the electronic device(s) to become damaged and/or reduce an operating life of the electronic device(s) and, thus, the UAVs that carry the device(s)/component(s).

To dissipate heat of the high computing devices and/or electronic device(s), known UAVs employ a cooling system that includes a fan assembly or system. However, such a fan assembly typically consumes significant power, and increases parts count, cost and/or weight of the UAVs. Due to its size, such fan assembly increases a dimensional envelope (e.g., a dimensional thickness, a dimensional height, etc.) of the UAVs housing/body, thereby preventing construction of UAVs having relatively low profiles. Some such known fan assembly systems protrude from the body of the UAV and/or require protrusions in the body/housing of the UAV, thereby negatively affecting a coefficient of drag of the UAV and reducing aerodynamic characteristic(s) of the UAV.

Example UAVs disclosed herein overcome one or more the above problems by employing a thermal management system or cooling system (e.g., a forced convection system) that is integrated to a frame or body of the UAV. In this manner, example thermal management systems disclosed herein reduce costs, parts count, and/or weight of the UAVs in which they are employed. Additionally or alternatively, example UAVs disclosed herein exhibit a housing/body with a reduced dimensional envelope compared to known UAVs. For example, UAVs disclosed herein may be configured with significantly smaller dimensional heights compared to UAVs that employ a conventional fan assembly. Example thermal management systems (e.g., blower fans) disclosed herein do not protrude from outermost surfaces of a body or frame of the UAVs. Thus, aerodynamic characteristic(s) of example UAVs disclosed herein are not negatively affected by the thermal management systems disclosed herein.

Example UAVs disclosed herein may include a housing defining a cavity to receive electrical component(s)/device(s) of the vehicle and a thermal management system to dissipate heat generated by the electrical component(s)/device(s). The electrical component(s)/device(s) can include a processor to control operation of motor(s), blower(s), propeller(s) and/or other aspects of the UAV. In this disclosure, electrical component(s) and electrical device(s) are used interchangeably herein.

Example thermal management systems disclosed herein have frames that include a fluid duct defining a fluid flow path. In some examples, the fluid duct of the frame defines an inlet and an outlet to allow fluid flow through the fluid flow path. In some examples, a first blower fan is positioned adjacent the inlet to draw fluid (e.g., ambient air) into the fluid flow path via the inlet. In some examples, a second blower fan is positioned adjacent the outlet to exhaust fluid (e.g., hot air that absorbed heat from the electrical components of the UAVs) from the fluid flow path. In some examples, a first motor drives the first blower fan adjacent the inlet and a second motor drives the second blower fan adjacent the outlet. In some examples, the fluid flow path extends between a first propeller of the vehicle and a second propeller of the vehicle. In some examples, the first propeller is driven via the first motor and the second propeller is driven via the second motor. In some such examples, the first motor simultaneously drives the first propeller and the first blower fan, and the second motor simultaneously drives the second propeller and the second blower fan. In some such examples, the thermal management system disclosed herein increases (e.g., maximizes) a power efficiency of the first and second motors because additional power is not needed or provided to the blower fans for cooling purposes.

In some examples, the first propeller is driven via a third motor and the second propeller is driven via a fourth motor. In some such examples, the first and second motors operate independently from the third and fourth motors. In some examples, the fluid flow path of the UAV exhibits a cross-sectional profile of different dimensions between the inlet and the outlet to improve at least one of fluid flow characteristic(s) or heat transfer characteristic(s) of the thermal management system. In some examples, a thermal conductive plate is at least partially positioned in the fluid flow path between the inlet and the outlet to improve heat transfer between the electrical component(s) and the fluid flowing between the inlet and the outlet.

Figure 1B:
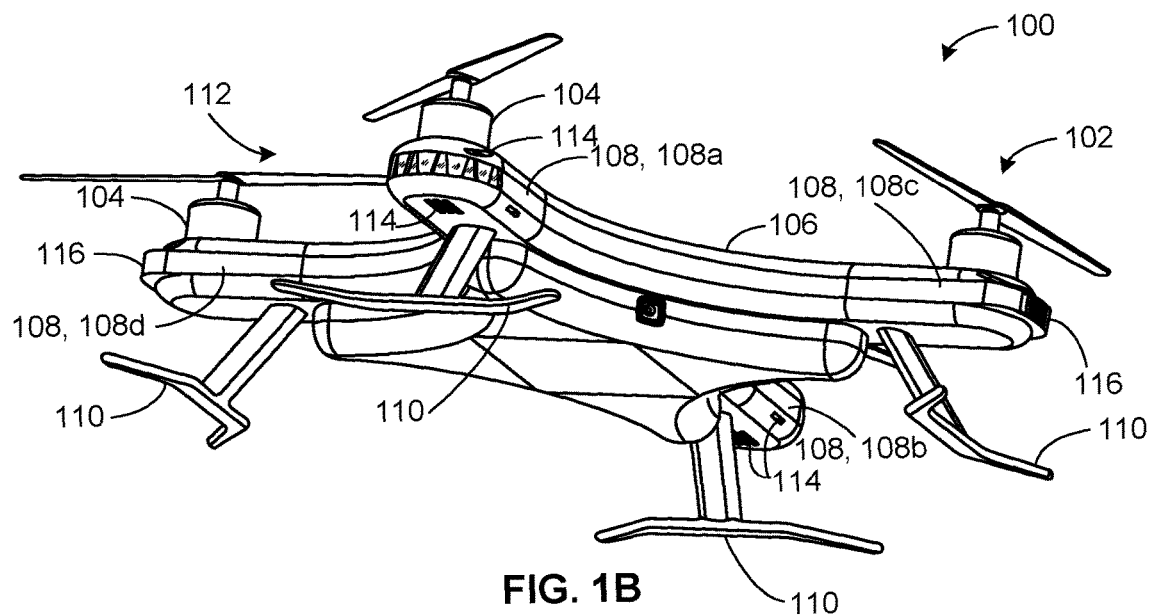
FIG. 1B is a bottom perspective view of the example UAV of FIG. 1A.

FIGS. 1A and 1B are perspective views of an example UAV 100 constructed in accordance with the teachings of this disclosure. To generate lift and/or to maneuver the UAV 100, the UAV 100 of the illustrated example includes a propulsion system 102. The propulsion system 102 of the UAV 100 of the illustrated example includes one or more rotor assemblies 104. To support the rotor assemblies 104, the UAV 100 of the illustrated example includes a housing 106 (e.g., a body or a housing providing a frame for supporting components of the UAV 100). To support the respective ones of the rotor assemblies 104, the housing 106 of the illustrated example includes one or more example arms 108. The UAV 100 of the illustrated example includes four rotor assemblies 104. As such, it may be referred to as a quad-copter. Thus, the housing 106 of the illustrated example includes a first arm 108a, a second arm 108b, a third arm 108c and a fourth arm 108d to support the respective ones of the rotor assemblies 104. For example, the housing 106 of the illustrated example has an X-shaped profile. However, other UAV body and/or rotor configurations may alternatively be used such as, for example, a helicopter configuration (e.g., one horizontal rotor and one vertical rotor), a fixed wing configuration, etc. Moreover, the UAV 100 may include less than, or more than, four arms 108 and/or rotor assemblies 104. The housing 106 of the illustrated example supports landing gear 110 (e.g. legs).

Additionally, the housing 106 of the illustrated example contains or encloses electrical component(s) that enable operation of the UAV 100. To remove or dissipate heat generated by one or more of the electrical component(s) positioned in the housing 106, the UAV 100 of the illustrated example employs a thermal management system 112 (e.g., a cooling system, a forced air convection system, etc.). The thermal management system 112 of the illustrated example is formed (e.g., integrated) with the housing 106 of the UAV 100. The thermal management system 112 of the illustrated example employs a cooling fluid to cool the electrical component(s) positioned in the body of the UAV 100. More specifically, the thermal management system 112 of the illustrated example employs atmospheric air to cool the electrical components of the UAV 100.

To enable fluid flow through the housing 106, the housing 106 of the UAV 100 of the illustrated example defines a fluid flow path through an internal cavity of the housing 106 between an inlet 114 and an outlet 116 defined in external surfaces of the housing 106. For example, the thermal management system 112 of the illustrated example draws fluid (e.g., atmospheric air) into the inlet 114 (e.g., via a blower adjacent the inlet 114), channels the fluid through an interior (e.g., a central area or central portion 118) of the housing 106 to cool the electrical component(s) positioned within the housing 106, and channels or exhausts the fluid from the housing 106 via the outlet 116 (e.g., to the atmosphere via a blower adjacent the outlet 116). For example, one or more of the arms 108 of the illustrated example may provide or define (e.g., include, house, etc.) a flow path fluidly coupling the inlet 114 and the outlet 116. In the illustrated example, the arms 108 have respective first or distal ends that project or are spaced from the central portion 118 (e.g., a central area) to support respective ones of the rotor assemblies 104 and respective second or proximal ends adjacent or coupled to the central portion 118.

FIGS. 2A and 2B are respectively bottom and top perspective views of the example inlet(s) 114 of the example UAV 100 of FIGS. 1A and 1B. To enable fluid flow (e.g., airflow) into the housing 106, the inlet 114 of the illustrated example is implemented as one or more holes (e.g., apertures, slots, etc.) that provide fluid communication between the atmosphere external to the housing and the interior of the housing 106. In this example, the inlets 114 are located at an end of one or more of the arms 108. As used herein, an inlet is a through hole or other passage that permits air to pass from outside the housing 106 to the interior of the housing 106 for the purpose of cooling. It will be understood that an inlet may include one or more holes. Indeed, one or more holes may be referred to collectively as an inlet or individually as an inlet.

Figure 3:
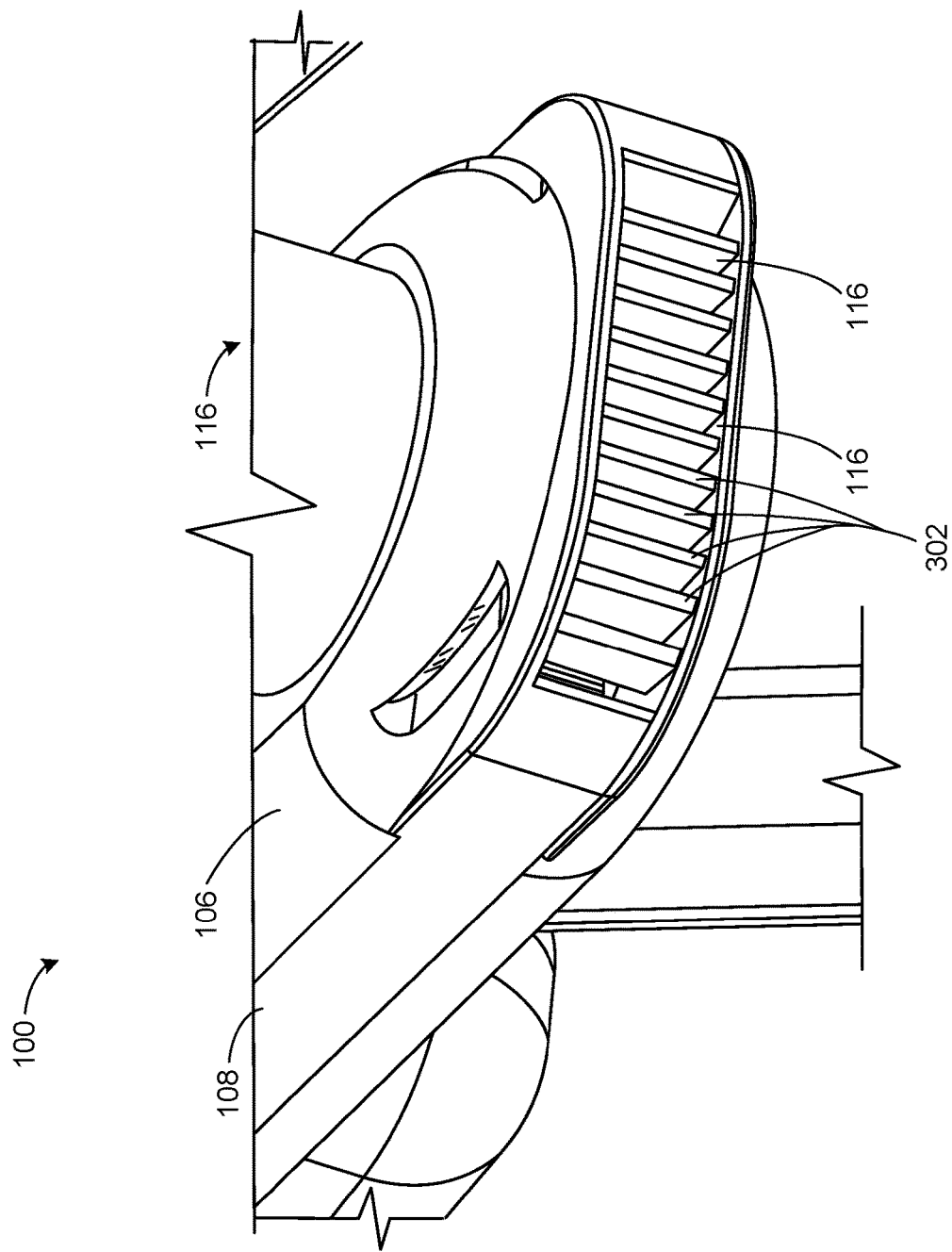
FIG. 3 is a top perspective view of an example outlet of the example UAV of FIGS. 1A and 1B.

FIG. 3 is an enlarged, top perspective view of an example arm 108 of the example UAV 100 of FIGS. 1A and 1B. To exhaust fluid from the housing 106, the arm 108 of the illustrated example includes one or more outlets 116 (e.g., apertures, slots, etc.) that provide fluid communication between the atmosphere external to the housing 106 and the interior of the housing 106. In this example, the outlet(s) 116 are located at an end of the one or more arms 108. In this example, the outlet 116 includes a plurality of ribs or walls 302 to prevent debris from entering the housing 106. As used herein an outlet is a through hole or other passage that permits air to pass from inside the housing 106 to outside the housing 106 (e.g., to the atmosphere) for the purpose of cooling. It is to be understood that an outlet may include one or more holes. Indeed, one or more holes may be referred to collectively as an outlet or individually as an outlet.

Figure 4A:
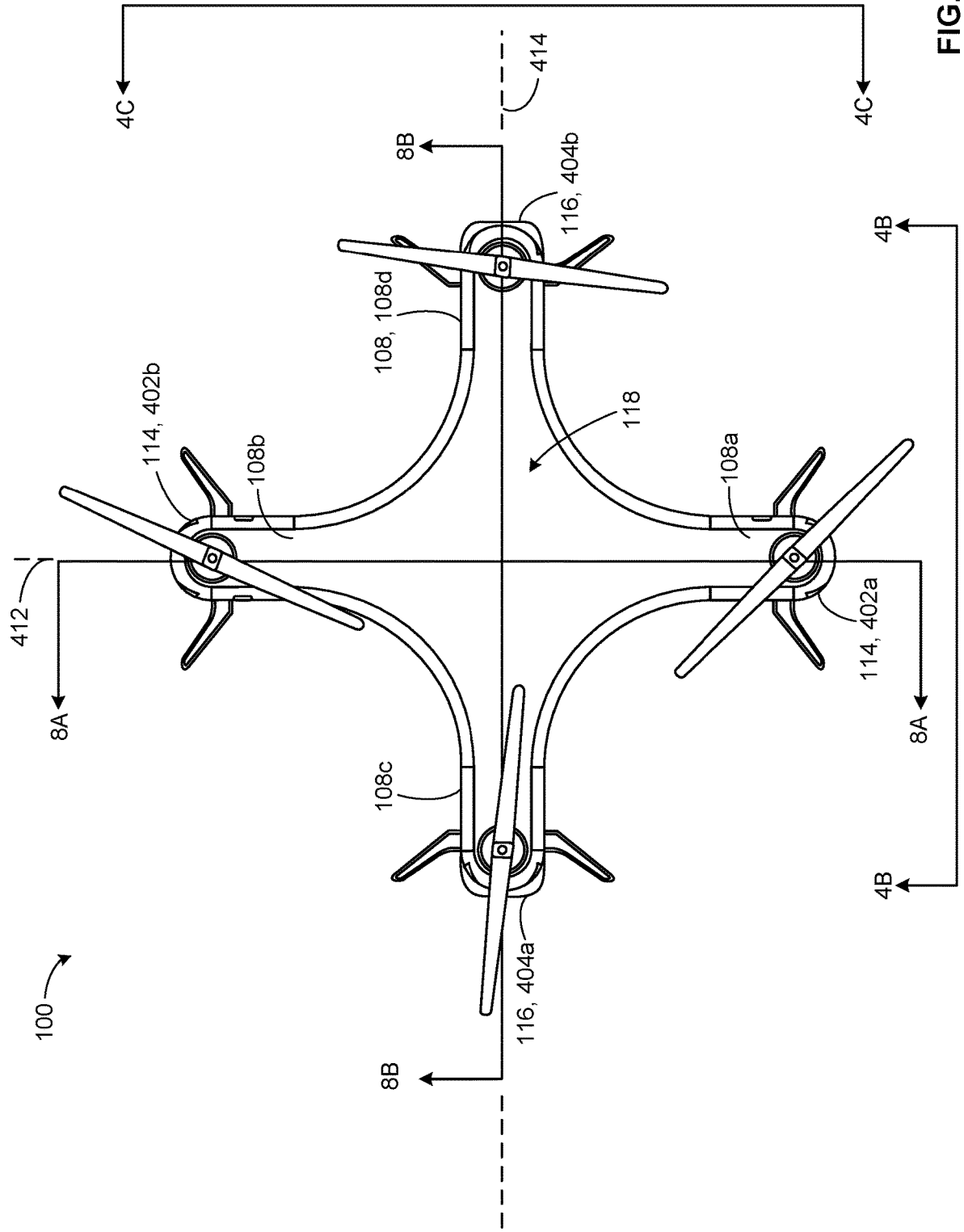
FIG. 4A is a top, cross-sectional view of the example UAV of FIGS. 1A and 1B.
Figure 4D:
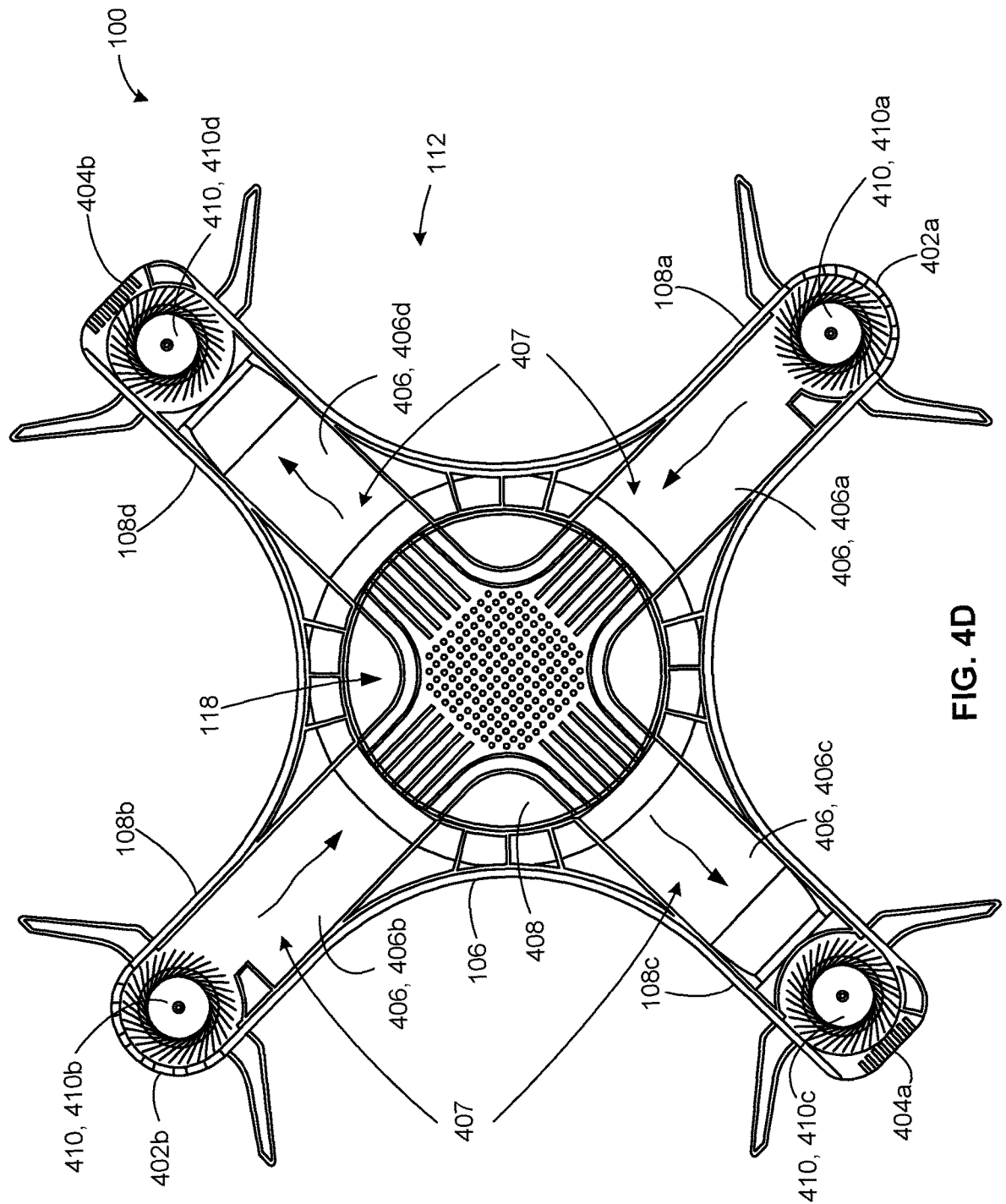
FIG. 4D is a top view of the example UAV of FIGS. 1A and 1B taken along line 4D-4D of FIG. 4B.

FIG. 4A is a top view of the example UAV of FIGS. 1A and 1B. FIG. 4B is a front view of the example UAV taken along line 4B-4B of FIG. 4A. FIG. 4C is a side view of the example UAV taken along line 4C-4C of FIG. 4A. FIG. 4D is a top view of the example UAV taken along line 4D-4D of FIG. 4B.

The inlet 114 of the thermal management system 112 of the illustrated example includes a first inlet 114a positioned adjacent the first arm 108a of the housing 106 and a second inlet 114b positioned adjacent the second arm 108b of the housing 106. Additionally, the outlet 116 of the thermal management system 112 of the illustrated example includes a first outlet 116a positioned adjacent the third arm 108c of the housing 106 and a second outlet 116b positioned adjacent the fourth arm 108d of the housing 106. In particular, in the illustrated example, a distal end of the first arm 108a defines the first inlet 114a and a proximal end of the first arm 108a is coupled to the central portion 118. In the illustrated example, a distal end of the second arm 108b defines the second inlet 114b and a proximal end of the second arm 108b is coupled to the central portion 118. In the illustrated example, a distal end of the third arm 108c defines the first outlet 116a and a proximal end of the third arm 108c is coupled to the central portion 118. In the illustrated example, a distal end of the fourth arm 108d defines the second outlet 116b and a proximal end of the fourth arm 108d is coupled to the central portion 118.

To channel fluid flow between the inlet(s) 114 and respective one(s) of the outlet(s) 116, the interior of the housing 106 of the UAV 100 of the illustrated example defines one or more fluid flow path(s) 406 (FIG. 4D). The fluid flow path(s) 406 of this example are provided or defined by a duct 407 positioned within the housing 106. In this example, the duct 407 is formed by integral walls of the interior of the housing 106. Specifically, the interior walls of the first arm 108a of the illustrated example fluidly couples the first inlet 114a to the central portion 118 of the housing 106. The interior walls of the second arm 108b of the illustrated example fluidly couples the second inlet 114b to the central portion 118. Similarly, the interior walls of the third arm 108c fluidly couples the central portion 118 to the first outlet 116a and interior walls of a fourth arm 108d fluidly couples the central portion 118 to the second outlet 116b. In this example, the first arm 108a is opposite the second arm 108b. The third arm 108c is opposite the fourth arm 108d.

More specifically, the first arm 108a provides a first passageway 406a (e.g., a first flow path) in fluid communication with the first inlet 114a and the central portion 118. The second arm 108b provides a second passageway 406b (e.g., a second flow path) in fluid communication with the second inlet 114b and the central portion 118. The third arm 108c provides a third passageway 406c (e.g., a third flow path) in fluid communication with the central portion 118 and the first outlet 116a. The fourth arm 108d provides a fourth passageway 406d (e.g., a fourth flow path) in fluid communication with the central portion 118 and the second outlet 116b. Thus, the central portion 118 of the illustrated example fluidly couples the first, second, third and fourth passageways 406a-d.

The thermal management system 112 of the illustrated example includes a heatsink 408 positioned or at least partially received within (e.g., interposed in) the fluid flow path 406. In this example, the heatsink 408 is positioned in the central portion 118 of the housing 106. The heatsink 408 to be at least partially positioned to contact fluid flowing through the central portion 118 from the inlets 114a-b to the outlets 116a-b.

To move fluid or generate fluid flow through the fluid flow path 406 between the inlets 114a-b and the outlets 116a-b (e.g., to force airflow through the fluid flow path 406), the thermal management system 112 of the illustrated example includes one or more blower fans 410. In some examples, the blower fans 410 of the illustrated example provide means for generating airflow through the housing 106. For example, the thermal management system 112 of the illustrated example includes at least one of a first blower fan 410a located at the distal end of the first arm 108a adjacent the first inlet 114a or a second blower fan 410b located at the distal end of the second arm 108b adjacent the second inlet 114b, and at least one of a third blower fan 410c located at the distal end of the third arm 108c adjacent the first outlet 116a and a fourth blower fan 410d located at the distal end of the fourth arm 108d adjacent the second outlet 116b. The first and second blower fans 410a-b of the illustrated example induce or draw fluid (e.g., ambient, cold air) from an exterior of the housing 106, through the inlets 114a-b and into the respective first and second passageways 406a-b. The third and fourth blower fans 410c-d of the illustrated example exhaust or direct fluid (e.g., hot air) from the third and fourth passageways 406c-d, through the outlets 116a-b, and to the exterior of the housing 106.

To help maintain the UAV 100 of the illustrated example in balance during flight without being negatively affected by fluid (e.g., an airflow) entering the housing 106, the first inlet 114a of the illustrated example is positioned opposite to the second inlet 114b (e.g., on opposing sides of a first longitudinal axis 412 (FIG. 4A) of the UAV 100) and the first outlet 116a is positioned opposite to the second outlet 116b (e.g., on opposing sides of a second longitudinal axis 414 (FIG. 4A) of the UAV 100). The first and second longitudinal axes 412 and 414 are perpendicular to one another. In some examples, the first blower fan 410a is located on a diametrically opposite side of the central portion 118 from the second blower fan 410b. The third blower fan 410c is located on a diametrically opposite of the central portion 118 from the fourth blower fan 410d.

The example thermal management system 112 is not limited to the example shown in FIGS. 1A, 1B, 2, 3 and 4A-4D. In some examples, the first inlet 114a may be positioned opposite the first outlet 116a and the second inlet 114b may be positioned opposite the second outlet 116b. For instance, in some examples, the thermal management system 112 may include only one inlet 114 and only one outlet 116. In some such examples, one of the first arm 108a or the second arm 108b provides fluid communication between the inlet 114 and the central portion 118 and one of the third arm 108c or the fourth arm 108d provides fluid communication between the central portion 118 and the outlet 116. In some such examples, the fluid flow path 406 may include only one of the first passageway 406a or the second passageway 406b and only one of the third passageway 406c or the fourth passageway 406d and/or the central portion 118.

In some example UAVs disclosed herein, more than two inlets 114, more than two outlets 116 and/or any combination of the inlets 114 and the outlets 116 are provided. For instance, in some examples, UAVs include one inlet 114 and two or more outlets 116. In other examples, UAVs include two or more inlets 114 and only one outlet 116. For example, a UAV may include one inlet 114 and three outlets 116 or, alternatively, three inlets 114 and one outlet 116. In some such examples, the fluid flow path 406 of the illustrated example may include three passageways (e.g., the passageways 406a-c) fluidly coupling the inlets 114 of the housing 106 to the central portion 118 and one passageway (e.g., the fourth passageway 406d) fluidly coupling the central portion 118 to the outlet 116. In some examples, the thermal management system 112 of the illustrated example may include less than four blower fans 410 or more than four blower fans 410. Some example UAVs include one or more blower fans 410 interposed or positioned within the fluid flow path 406 between the inlets 114 and the outlets 116. For example, one or more blower fans 410 may be positioned along any portion (e.g., a midpoint) of the passageways 410a-d and/or in the central portion 118.

Figure 5:
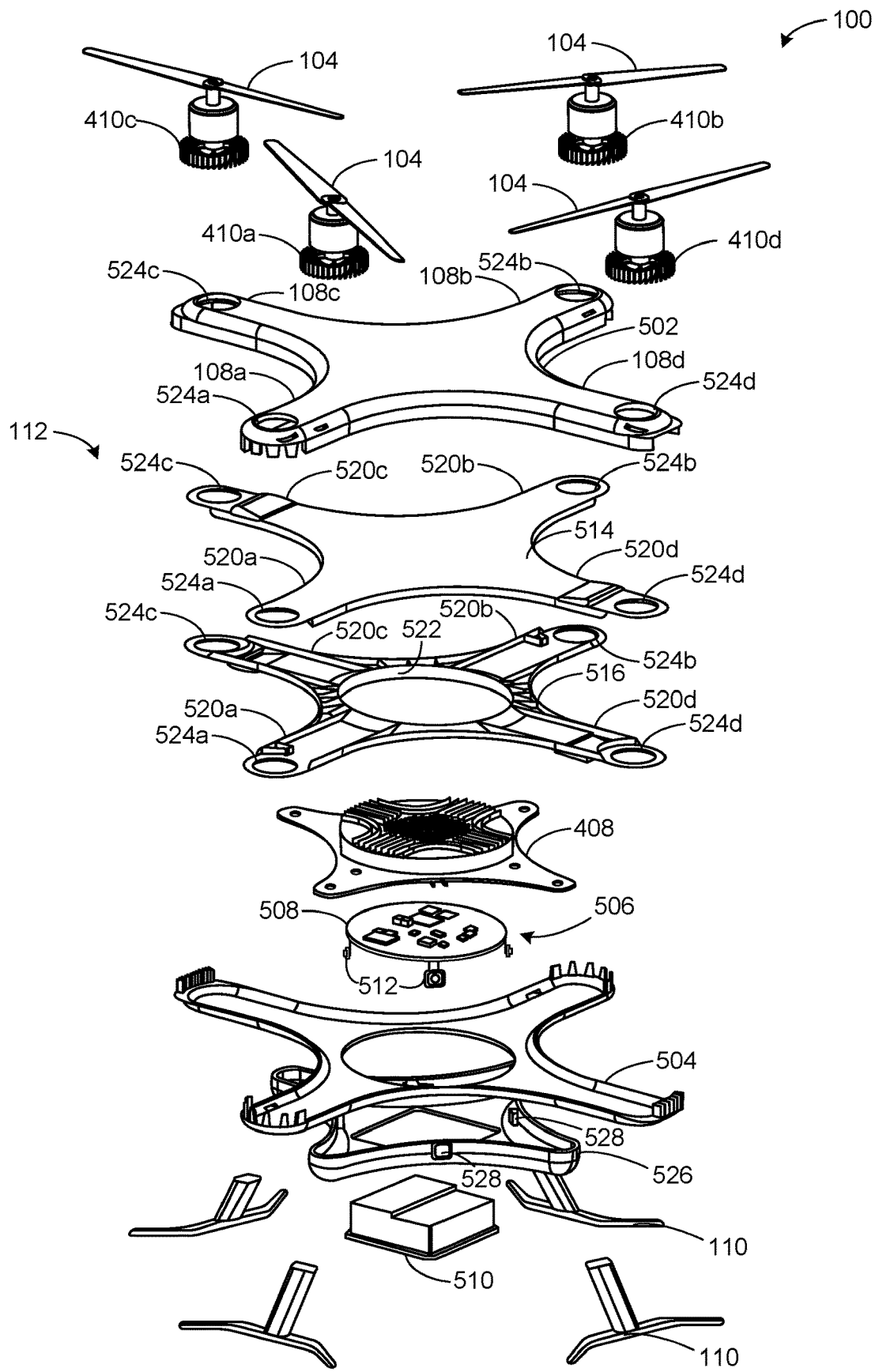
FIG. 5 is an exploded view of the example UAV of FIGS. 1A and 1B.

FIG. 5 is an exploded view of the example UAV 100 of FIGS. 1A, 1B and 4A-4D. The housing 106 of the UAV 100 of the illustrated example includes first cover 502 (e.g., an upper housing) and a second cover 504 (e.g., a lower housing). The first cover 502 of the illustrated example couples to the second cover 504 to house or enclose one or more electrical components 506 (e.g., a heat source) of the UAV 100. The electrical components 506 of the illustrated example include, for example, a circuit board 508 (e.g., a system-on-chip, a microprocessor, etc.), a power source 510 (e.g., a lithium-ion battery) for powering the propulsion system 102 and/or for powering the thermal management system 112, one or more cameras 512 (e.g., 3D camera), an antenna, one or more light emitting diodes (e.g., LEDs), and/or any other electronic component(s) of the UAV 100. The electrical components 506 and/or the circuit board 508 can include a processor to control the operation of the propulsion system 102 (e.g., motors or propellers of the rotor assemblies 104), the blower fans 410a-d of the thermal management system 112, and/or other aspects of the UAV 100.

The thermal management system 112 of the illustrated example includes a first duct plate 514, a second duct plate 516, the heatsink 408, and the blower fans 410a-d. The first duct plate 514 of the illustrated example couples to the second duct plate 516 to define the duct 407. Specifically, the first duct plate 514 cooperates with the second duct plate 516 to at least partially define at least a portion of the fluid flow path 406 of the thermal management system 112 (e.g., at least one of the first passageway 406a, the second passageway 406b, the third passageway 406c and the fourth passageway 406d. More specifically, each of the first duct plate 514 and the second duct plate 516 include arms 520a-d that extend between an opening 522 (e.g., the central portion 118) and a respective one of the blower fans 410a-d. More specifically, respective ones of the arms 520a-d of the first duct plate 514 align with respective ones of the arms 520a-d of the second duct 316. Additionally, respective ones of the arms 520a-d of the first duct plate 514 and the second duct plate 516 align with respective ones of the arms 108a-d of the housing 106 when the first duct plate 514 and the second duct plate 516 are positioned between the first cover 502 and the second cover 504. The first duct plate 514 and the second duct plate 516 of the illustrated example have a similar shape or profile (e.g., a perimeter shape) relative to the profile of the first cover 502 and the second cover 504. The first and second duct plates 514 and 516 to align such that their inner walls cooperate to define the duct 407. Thus, the inner walls of the first and second duct plates 514 and 516 are the inner walls of the housing 106 that define the fluid flow path 406. Thus, the first arm 108a, the second arm 108b, the third arm 108c and the fourth arm 108d of the illustrated example includes ducts defined by the first duct plate 514 and the second duct plate 516 positioned in the housing 106.

To receive a respective one of the blower fans 410a-d and/or the rotor assemblies 104, each of the first cover 502, the first duct plate 514 and the second duct plate 516 include openings 524a-d. The openings 524a-d are dimensioned with diameters to enable at least a portion of the respective motor assemblies (e.g., the blower fans) to pass through without interfering with motor operation. Additionally, the second duct plate 516 includes a central opening 522 which is dimensioned to at least partially receive the heatsink 408. An enclosure 526 of the illustrated example is positioned beneath the second cover 504 to enclose the electrical components 506 within the housing 106. The enclosure 526 of the illustrated example includes peripheral apertures 528 to receive the cameras 512 and a central opening to receive the power source 510. The landing gear 110 of the illustrated example couples to at least one of the second cover 504 and/or the enclosure 526. The landing gear 110 of the illustrated example include a plurality of feet that supports a respective one of the arms 108a-d The first cover 502, the second cover 504, the first duct plate 514, the second duct plate 516, the heatsink 408, the enclosure 526, the landing gear 110, the blower fans 410 and/or generally the housing 106 of the illustrated example may be formed from plastic (e.g., glass-filed plastic), aluminum, magnesium, graphite, any other suitable material(s) and/or any combination thereof. For example, the first cover 502 and the second cover 504 may be composed of plastic, the first duct plate 514 and the second duct plate 516 may be composed of magnesium, and the heatsink 408 may be composed of a highly heat conductive material (e.g., aluminum). Additionally, the first cover 502, the second cover 504, the first duct plate 514, the second duct plate 516, the heatsink 408, the enclosure 526, the blower fans 410 and/or the housing 106 may be manufactured or formed via injection molding, stamping, machining, additive manufacturing (e.g., 3D printing) and/or any other suitable manufacturing process. In some examples, the first cover 502, the second cover 504, the first duct plate 514 and the second duct plate 516, the heatsink 408, and/or the landing gear 110 may be formed as a unitary structure via, for example, additive manufacturing techniques. In some examples, the remaining components are assembled with the frame after formation of the unitary structure. The first cover 502, the second cover 504, the first duct plate 514 and the second duct plate 516, the heatsink 408, the landing gear 110, and/or other components of the housing 106 may be coupled via mechanical or chemical fasteners (e.g., screws, rivets, adhesive, etc.), snap-fit connection, interference fit, and/or any other fastener(s).

Figures 6A, 6B:
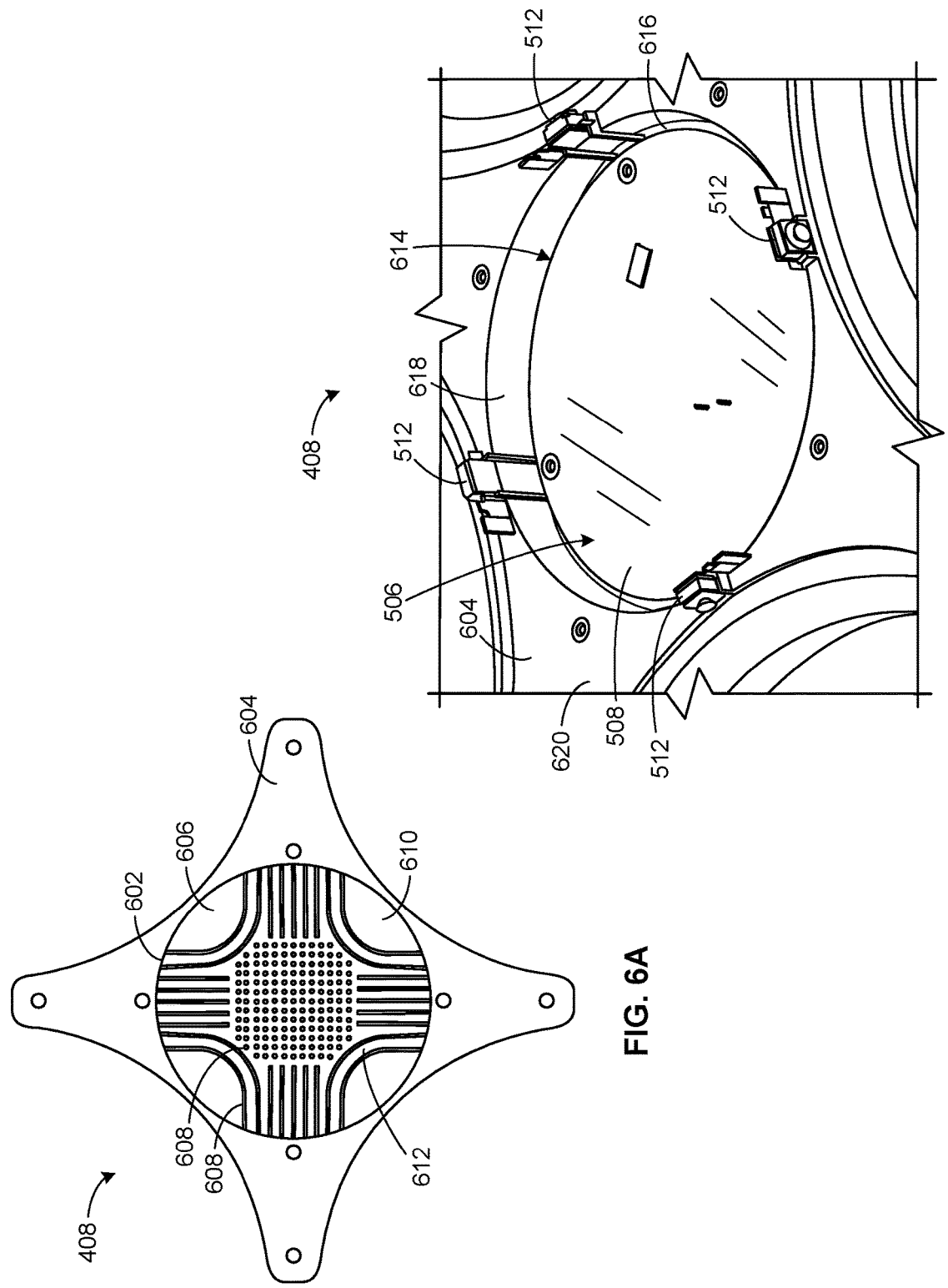
FIG. 6A is a top view of an example heatsink of the example UAV of FIGS. 1A and 1B.
FIG. 6B is a bottom view of the example heatsink of FIG. 6A.

FIG. 6A is a top view of the heatsink 408 of FIGS. 4D and 5. FIG. 6B is a partial, bottom perspective view of the example heatsink 408 and electrical components 506 of the example UAV 100. Referring to FIG. 6A, the heatsink 408 of the illustrated example includes a body 602 (e.g., a cylindrical body and/or a body having any other shape) projecting from a star shaped base 604 (e.g., a flange). The body 602 of the illustrated example includes a support surface 606. To improve (e.g., increase) heat transfer characteristic(s) of the heatsink 408, the body 602 of the heatsink 408 of the illustrated example includes one or more fins 608. The fins 608 of the illustrated example project or protrude from a first side 610 (e.g., an upper or outer surface) of the support surface 606. The fins 608 of the illustrated example project from the support surface 606 and form airflow paths or channels 612 for directing fluid flow (e.g., airflow) across the first side 610 of the support surface 606 of the heatsink 408. The fins 608 and/or the channels 612 of the illustrated example increase a surface area of the heatsink 408, thereby improving heat transfer. In some examples, the heatsink 408 may include heat pipes and/or vapor chambers to improve (e.g., increase) heat transfer characteristic(s) of the heatsink 408.

Referring to FIG. 6B, the body 602 of the heatsink 408 of the illustrated example includes an opening or cavity 614 to receive the circuit board 508 and/or the electrical components 506. The circuit board 508 of the illustrated example is supported by (e.g., directly engages or contacts) a second side 616 (e.g., an inner side) of the support surface 606 defining the cavity 614. In the illustrated example, a wall 618 formed by the body 602 and the cavity 614 of the heatsink 408 surrounds (e.g., encircles) the circuit board 508. Thus, the circuit board 508 of the illustrated example is recessed relative to a bottom surface 620 of the base 604. Additionally, the cameras 512 of the illustrated example are communicatively coupled (e.g., wired) to the circuit board 508. The cameras 512 are surrounded by and/or otherwise supported by the heatsink 408. In the illustrated example, the cameras 512 are radially spaced (e.g., in ninety degree intervals) relative to a longitudinal axis of the cavity 614. Thus, the heatsink 408 of the illustrated example dissipates heat generated by the circuit board 508, the cameras 512 and/or the electrical components 506 of the UAV 100.

Additionally, the support surface 606 and/or the heatsink 408 of the illustrated example isolates the circuit board 508 and/or the electrical components 506 from fluid, dust, and/or other debris in the fluid flow path 406 of the thermal management system 112. In other words, the support surface 606 restricts fluid from flowing between the first side 610 adjacent the fins 608 and the second side 616 adjacent the electrical components 506. A seal (e.g., an O-ring) may be provided between the body 602 and/or the base 604 and the housing 106 (e.g., the second duct plate 516, the second cover 504) to seal the cavity 614 from the fluid, dust, and/or other debris flowing in the fluid flow path 406.

Figure 7A:
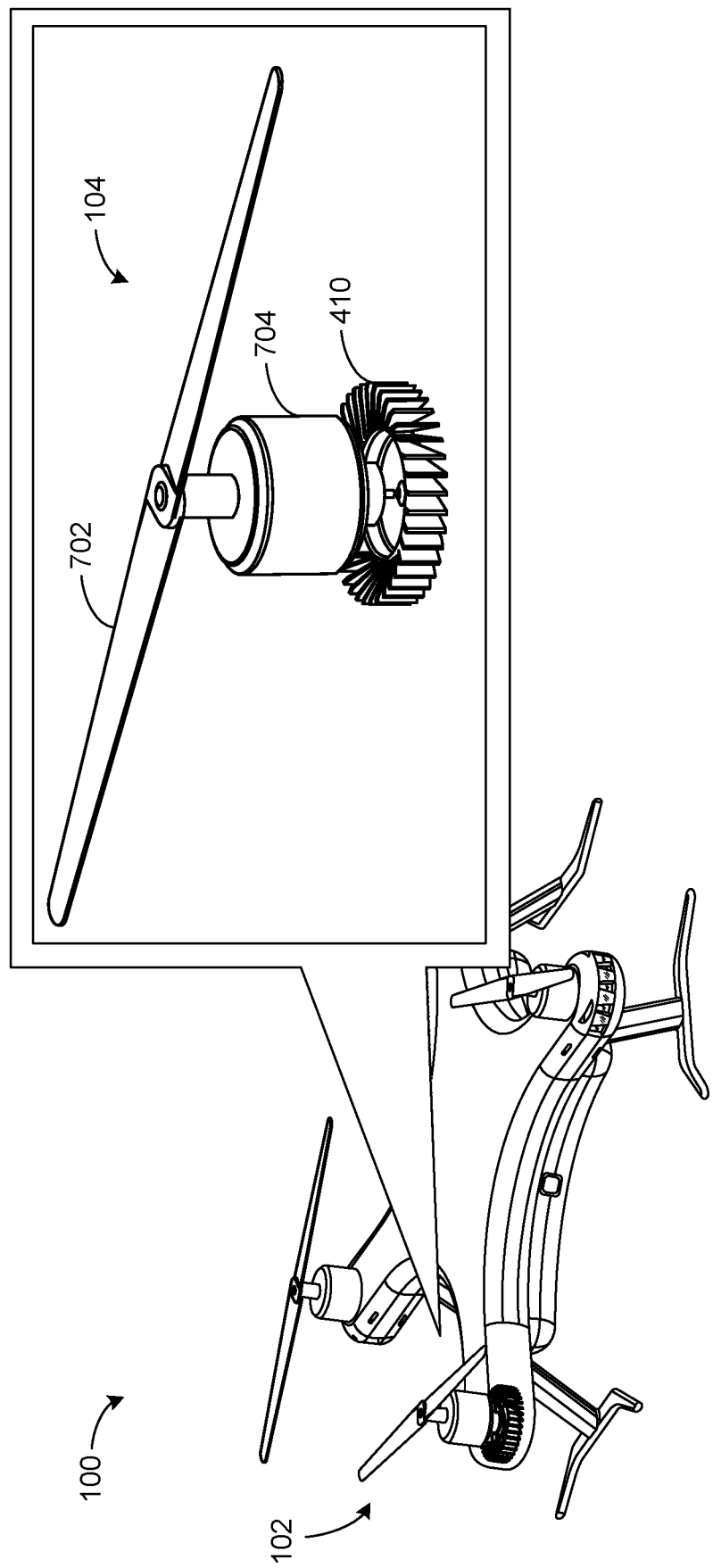
FIG. 7A is a perspective view of an example rotor assembly of the example UAV of FIGS. 1A and 1B.
Figure 7B:
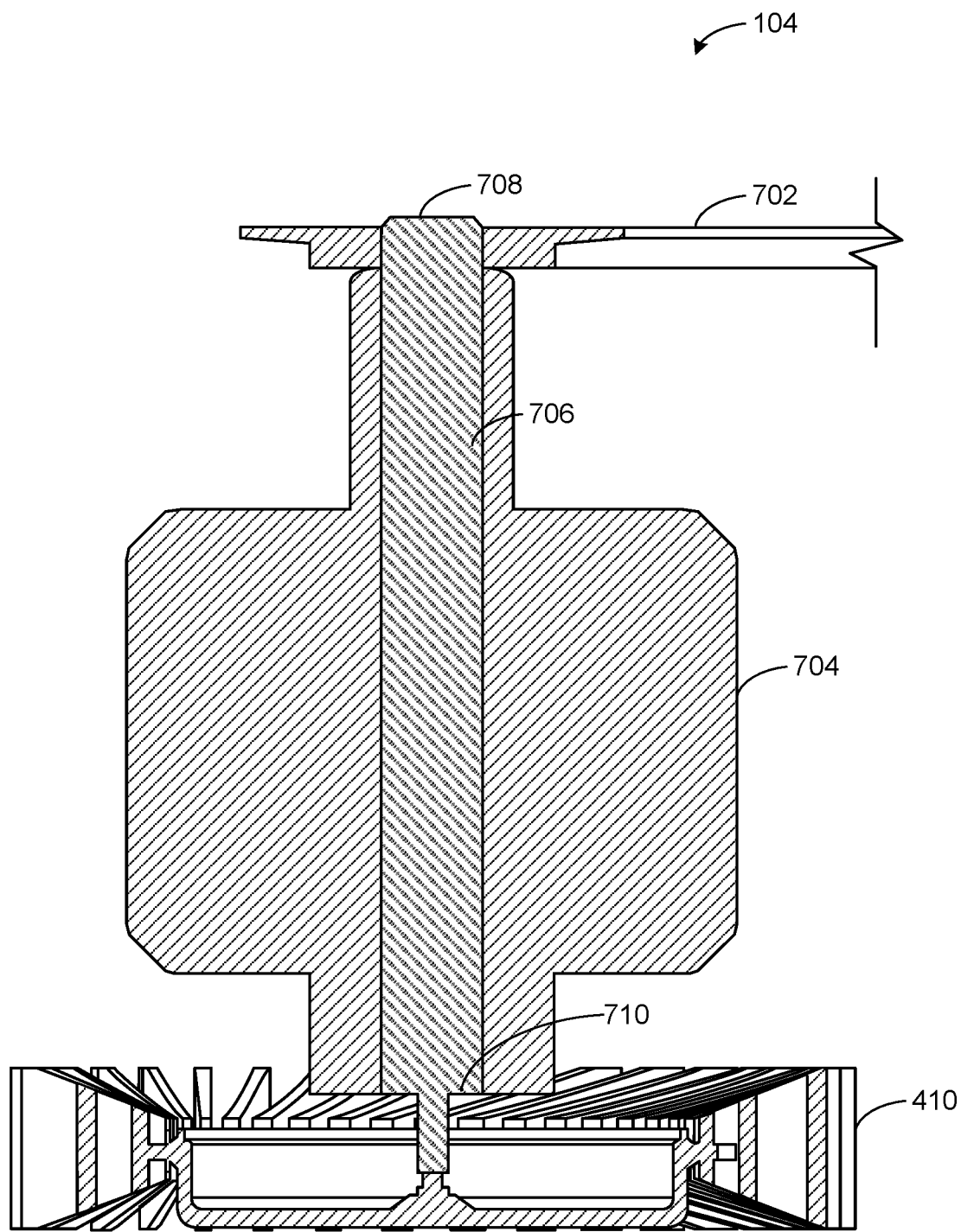
FIG. 7B is a cross-sectional view of the example rotor assembly of FIG. 7A.

FIG. 7A illustrates the example rotor assembly 104 of the example propulsion system 102 of the UAV 100 of FIGS. 1A and 1B. FIG. 7B is a cross-sectional view of the example rotor assembly 104 of FIG. 7A. The rotor assembly 104 of the illustrated example includes a rotor or propeller 702 (e.g., a blade) that is driven by a motor 704 (e.g., an electric motor such as a direct current (DC) motor). The motor 704 rotates the propeller 702 to generate lift and/or maneuver the UAV 100. Thus, the propeller 702 provides means for providing lift to the housing 106. The blower fan 410 is driven by the motor 704. As such, the motor 704 of the illustrated example operates or drives both the propeller 702 and the blower fan 410 (e.g., simultaneously). However, in some examples, the propeller 702 may be driven by a first motor and the blower fan 410 may be driven by a second motor independently of the first motor. Using one motor to drive both the blower fan 410 and the propeller 702 may be advantageous for reducing weight and reducing parts count. In some examples, the motor 704 provides means for driving at least one of the blower fan 410 (e.g., the airflow generating means) or the propeller 702 (e.g., the lift generating means).

Referring to FIG. 7B, the motor 704 of the illustrated example includes an output shaft 706 having a first end 708 operatively coupled to the propeller 702 and a second end 710 operatively coupled to the blower fan 210. In this example, the propeller 702 of the illustrated example coaxially aligns with the blower fan 210. The motor 704 of the illustrated example rotates the propeller 702 and the blower fan 210, simultaneously. In some examples, a transmission (e.g., a gear train, a clutch, etc.) may be positioned between the first end 708 of the output shaft 706 and the propeller 702 and/or the second end 710 of the output shaft 706 and the blower fan 410 to increase or decrease an output (e.g., a rotational and/or angular speed) of the propeller 702 relative to an output (e.g., a rotational and/or angular speed) of the blower fan 410.

Figure 8A:
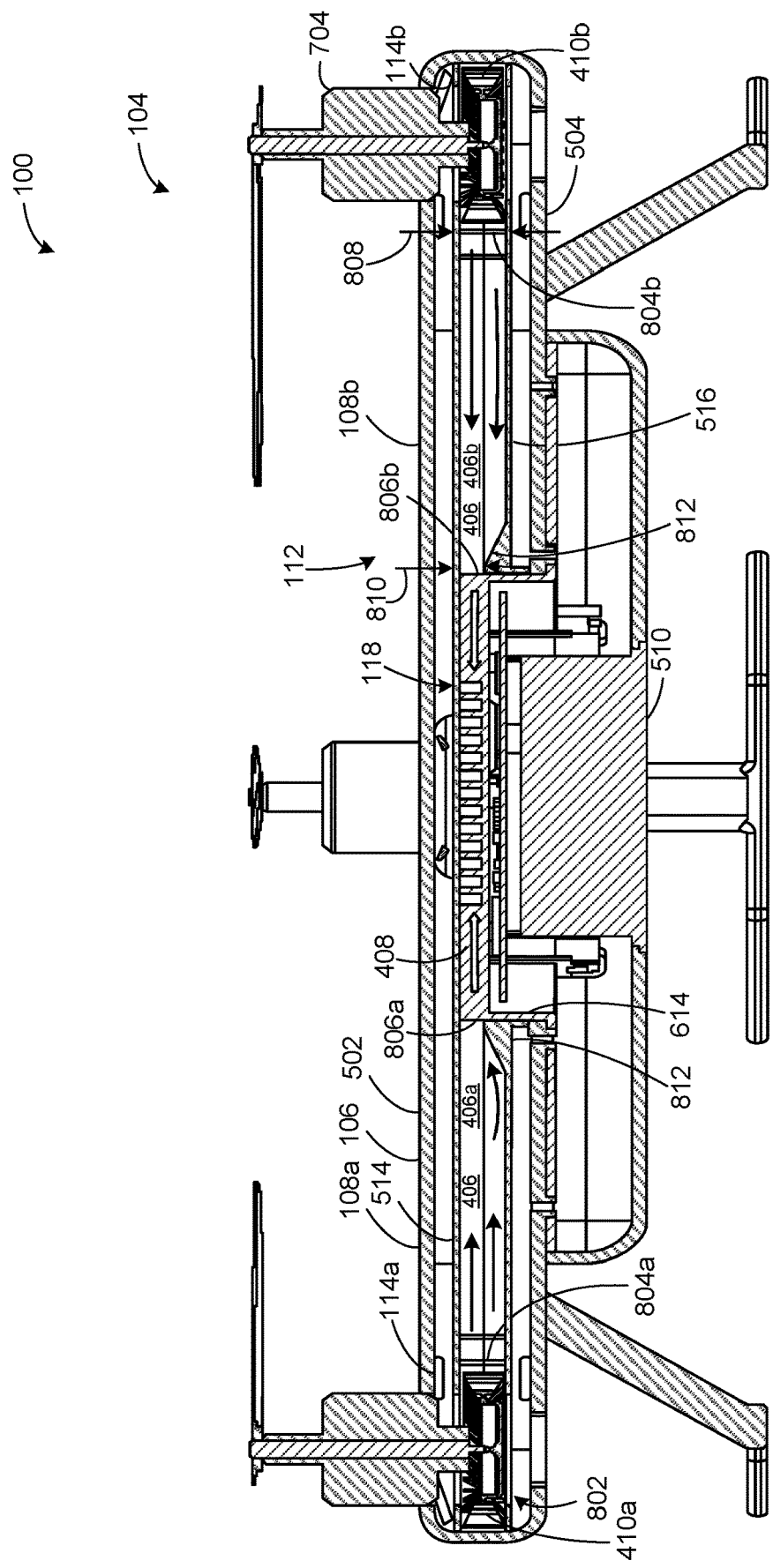
FIG. 8A is a cross-sectional view of the example UAV of FIGS. 1A and 1B taken along line 8A-8A of FIG. 4A.
Figure 8B:
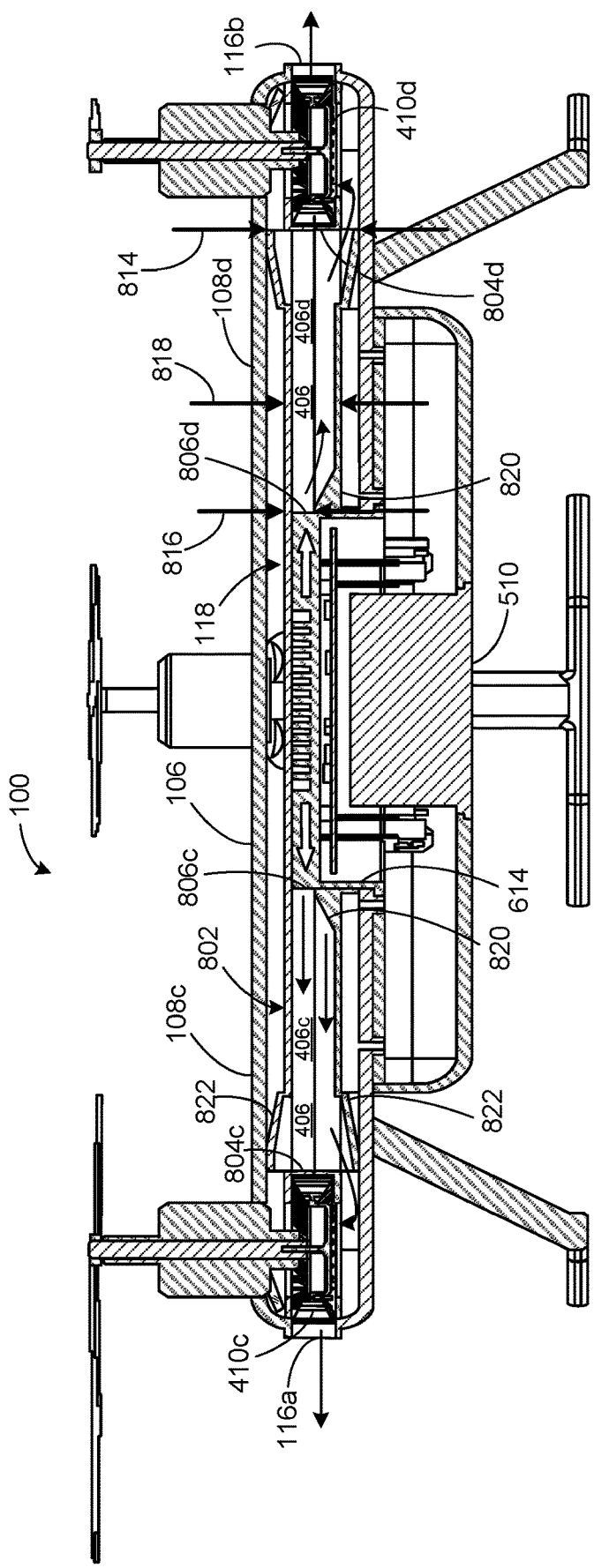
FIG. 8B is a cross-sectional view of the example UAV of FIGS. 1A and 1B taken along line 8B-8B of FIG. 4A.

FIG. 8A is a cross-sectional view of the example UAV 100 of FIGS. 1A, 1B, and 4A-4D taken along line 8A-8A of FIG. 4A. FIG. 8B is a cross-sectional view of the example UAV 100 of FIGS. 1A, 1B, and 4A-4D taken along line 8B-8B of FIG. 4A.

The first cover 502 of the illustrated example is coupled to the second cover 504 and defines a cavity 802 to receive the first duct plate 514 and the second duct plate 516 that cooperatively create the duct 407 to define the fluid flow path 406. The blower fans 410a-d of the illustrated example are coupled or positioned (e.g., captured) between the first duct plate 514 and the second duct plate 516. The motors 704 of the illustrated example are supported by the first cover 502. The body 602 of the heatsink 408 is at least partially received by the first duct plate 514 and the second duct plate 516 adjacent the central portion 118 of the housing 106. In the illustrated example, at least a portion of the power source 510 extends within the cavity 614 of the heatsink 408 adjacent the circuit board 508.

Referring to FIG. 8A, the first passageway 406a of the illustrated example includes a first end 804a adjacent the first inlet 114a and a second end 806a adjacent (e.g., in fluid communication with) the central portion 118 (e.g., where the heatsink 408 is located). Similarly, the second passageway 406b of the illustrated example includes a first end 804b adjacent the second inlet 114b and a second end 806b adjacent (e.g., in fluid communication with) the central portion 118. Referring to FIG. 8B, the third passageway 406c of the illustrated example includes a first end 804c adjacent the first outlet 116a and a second end 806c adjacent (e.g., in fluid communication with) the central portion 118. Similarly, the fourth passageway 406d of the illustrated example includes a first end 804d adjacent the second outlet 116b and a second end 806d (e.g., in fluid communication with) adjacent the central portion 118.

To improve (e.g., increase) heat transfer performance or characteristic(s) (e.g., heat transfer rate) between the fluid and the heatsink 408 and/or to improve fluid flow characteristic(s) through the fluid flow path 406, the fluid flow path 406 of the thermal management system 112 of the illustrated example has a profile whose dimensions differ along the fluid flow path 406 (e.g., a varying cross-sectional or dimensional characteristic(s)) between the inlets 114a-b and the outlets 116a-b. For example, the first passageway 406a has different cross-sectional profiles at different locations between the first inlet 114a and the central portion 118 to effect a fluid flow characteristic within the first passageway 406a. The second passageway 406b has different cross-sectional profiles at different locations between the second inlet 114b and the central portion 118 to effect a fluid flow characteristic within the second passageway 406b. The third passageway 406c has different cross-sectional profiles at different locations between the central portion 118 and the first outlet 116a to effect a fluid flow characteristic within the third passageway 406c. The fourth passageway 406d has different cross-sectional profiles at different locations between the central portion 118 and the second outlet 116b to effect a fluid flow characteristic within the fourth passageway 406d.

For example, a flow path opening or area across the heatsink 408 is narrower or smaller than a flow path opening or area through the passageways 406a-d. In this manner, fluid flowing through the fluid flow path 406 may flow across the heatsink 408 at a greater velocity than the velocity of the fluid in the other portions of the fluid flow path 406 (e.g., the passageways 406a-d). The greater the velocity of the fluid flowing across the heatsink 408 (e.g., the support surface 606 of the heatsink 408), the greater an amount of heat dissipation of heat generated by the circuit board 508, the LEDs, the cameras 512 and/or the electrical component 506. Additionally or alternatively, in some examples, the dimensional characteristic or profile of the fluid flow path 406 of the illustrated example improves or causes fluid flow in a direction from the first and second inlets 114a-b, toward the central portion 118, and toward the first and second outlets 116a-b.

For example, referring to equation 1, a volume flowrate of fluid through the fluid flow path 406 is dependent on a velocity of fluid and a cross-sectional area of the fluid flow path 406. As the cross-sectional area A of the flow path decreases, the velocity of the fluid increases, and vise-versa.

$$Q = V*A;\qquad\qquad \text{Eq.1:}$$

where Q is the volume flowrate, V is the velocity, and A is the cross-sectional area.

In this example, the first passageway 406a and the second passageway 406b of the illustrated example have decreasing cross-sections or profiles between the respective first ends 804a and the second ends 806a of the first and second passageways 406a-b. For example, a first cross-sectional area or dimensional characteristic 808 at the first ends 804a of the first and second passageways 406a-b is less than a cross-sectional area or dimensional characteristic 810 at the second ends 806a of the respective first and second passageways 406a-b. In other words, the first and second passageways 406a-b exhibit a converging flow path between the first ends 804a-b and the second ends 806a-b as the fluid flows from the first and second inlets 114a-b towards the central portion 118.

In this example, to reduce a cross-sectional area of the first passageway 406a and the second passageway 460b adjacent the central portion 118, respectively, each of the second ends 806a-b of the respective first and second passageways 406a-b of the illustrated example include an elevated surface 812 (e.g., a ramp) relative to the first ends 804a-b. In the illustrated example, the second duct plate 516 includes the elevated surface 812. However, in some examples, at least one of the first duct plate 514 or the second duct plate 516 may define the elevated surface 812. In the illustrated example, the elevated surface 812 is adjacent the heatsink 408 and causes a velocity of fluid to increase as the fluid flows from the first and second inlets 114a-b toward the heatsink 408.

Referring to FIG. 8B, a profile (e.g., a cross-sectional profile) of the fluid flow path 406 provided by the third and fourth passageways 406c-d increases as fluid flows from the second ends 806c-d of the third and fourth passageways 406c-d towards the first ends 804c-d of the third and fourth passageways 406c-d. In other words, the third and fourth passageways 406c-d defined by the first and second duct plates 514 and 516 provide a diverging flow path between the second ends 806c-d and the first ends 804c-d as the fluid flows from the central portion 118 towards the first and second outlets 116a-b.

For example, the third and fourth passageways 406c-d of the illustrated example have a first cross-sectional or dimensional characteristic 814 adjacent the first ends 804c-d, a second cross-sectional area or dimensional characteristic 816 adjacent the second ends 806c-d, and a third cross-sectional or dimensional characteristic 818 between the first and second ends 804c-d and 806c-d. In the illustrated example, the first dimensional characteristic 814 is greater than the second dimensional characteristic 816 and the third dimensional characteristic 818. The third dimensional characteristic 818 of the illustrated example is less than the second dimensional characteristic 816.

In the illustrated example, each of the second ends 806c-d of the illustrated example include an elevated surface 820 (e.g., a ramp) relative to the first ends 804c-d. Thus, the elevated surface 820 increases or expands a cross-sectional profile of the fluid flow path 406 as the fluid flows from the central portion 118 (e.g., across the plate) toward the first and second outlets 116a-b.

Additionally, the first duct plate 514 and the second duct plate 516 of the illustrated example include tapered surfaces 822 adjacent the respective first and second outlets 116a-b. The tapered surfaces 822 provide or form a diffusor adjacent the first and second outlets 404c-d. In the illustrated example, the passageways 406a-d have a rectangular cross-sectional shape. However, in other examples, the passageways 406a-d may have a square shape, circular shape, and/or any other shape.

FIG. 9A is an enlarged, partial cross-sectional view of the example first inlet 114a of FIG. 8A. FIG. 9B is an enlarged, partial cross-sectional view of the example second inlet 114b of FIG. 8A. The propeller 702, the motor 704, and the first blower fan 410a of a first one of the rotor assemblies 104 is located or supported at the distal end of the first arm 108a. The propeller 702, the motor 704 and the second blower fan 410b of a second one of the rotor assemblies 104 is located at or supported by the distal end of the second arm 108b. In operation, as the motors 704 rotate the propellers 702 to generate lift, the motors 704 of the illustrated example also rotate the blower fans 410a-b (e.g., in a clockwise direction and/or a counterclockwise direction) to draw fluid (e.g., atmospheric air) through the first inlet 114a (e.g., the openings) and the second inlet 114b. In FIGS. 9A-9B, the fluid flow is illustrated by arrows 901. In particular, the blower fans 410a-b draw fluid (e.g., air from the atmosphere) through (e.g., one or more holes) defining the first and second inlets 114a-b.

To enable fluid flow from the inlets 114a-b to (e.g., blades of) the respective blower fans 410a-b, the first duct plate 514 and the second duct plate 516 include the apertures 524a adjacent the first blower fans 410a and the apertures 524b adjacent the second blower fan 410b. In the illustrated example, the apertures 524a coaxially align with a rotational axis of the first blower fan 410a and the apertures 524b coaxially align with a rotational axis of the second blower fan 410b. The inlets 114a-b, the apertures 524a and/or the apertures 524b enable flow into the housing 106 in a direction that is non-parallel (e.g., perpendicular) relative to a longitudinal axis 902 of the first and second passageways 406a-b. The fluid of the illustrated example may be at a first temperature (e.g., ambient temperature).

Figure 10:
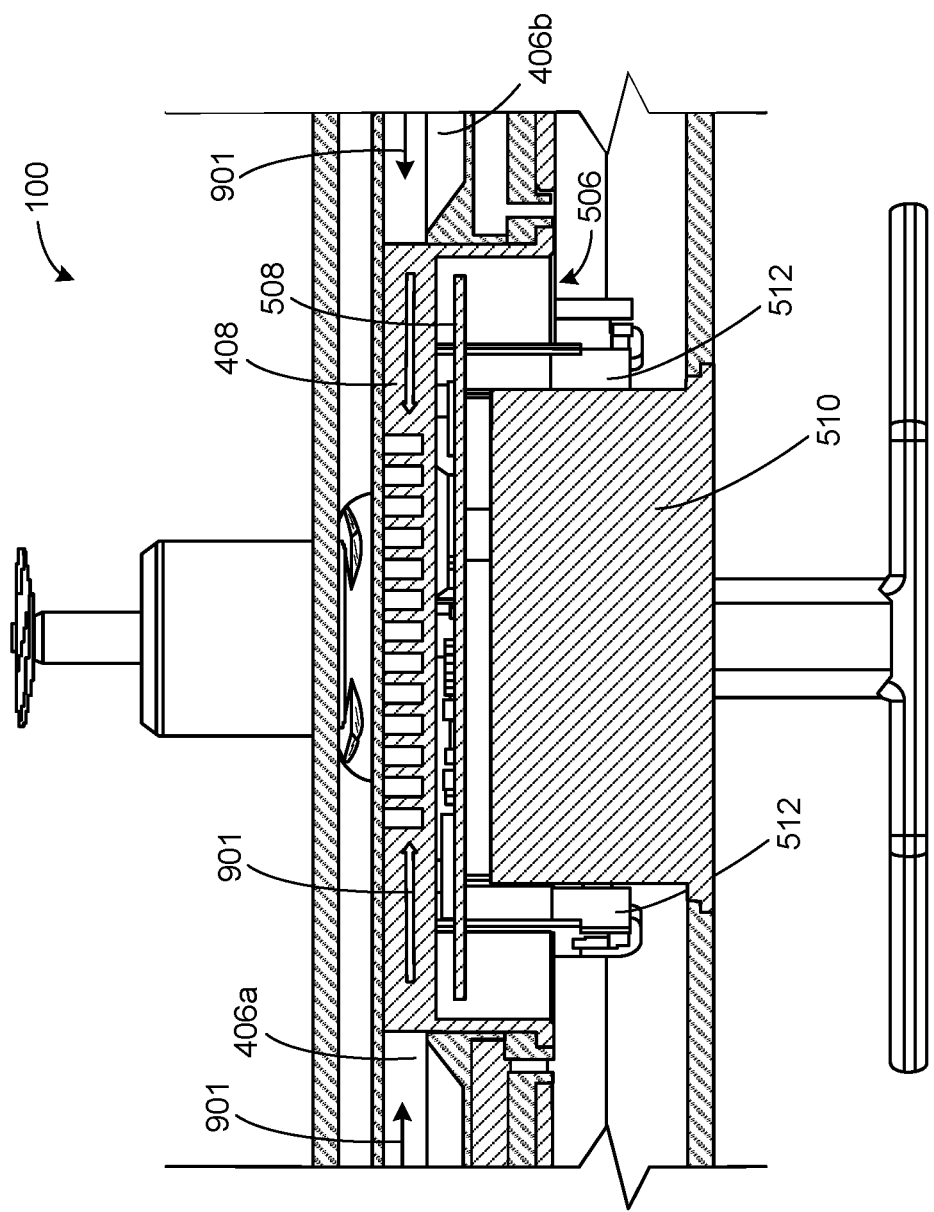

FIG. 10 is an enlarged view of a central portion of the example cross-section shown in FIG. 8A. In particular, FIG. 10 illustrated the first and second passageways 406a-b through which the fluid flows from the respective first and second inlets 114a-b towards the central portion 118 (e.g., the heatsink 408). In FIG. 10, the fluid flow is illustrated by arrows 901. During operation, the circuit board 508, the LEDs, the cameras 512, the power source 510, and/or the electrical component(s) 506 generate heat, which is at least partially absorbed by the heatsink 408. As the fluid is drawn into the first and second passageways 406a-b via the first and second inlets 114a-b, respectively, the fluid flows toward the central portion 118 via the first and second passageways 406a-b. As the fluid flows across the heatsink 408, the fluid absorbs heat from the heatsink 408 to dissipate heat generated by the electrical components 506. As noted above, the channels 612 and/or the fins 608 of the heatsink 408 improve heat transfer characteristic(s). Additionally, the profile of the fluid flow path 406 of the illustrated example improves (e.g., increase(s)) the heat transfer rate and dissipates heat generated by the electrical components 506 more quickly. Furthermore, the circuit board 508 of the illustrated example directly contacts the second side 616 of the heatsink 408 to improve heat transfer between the circuit board 508 and the heatsink 408.

Figure 11:
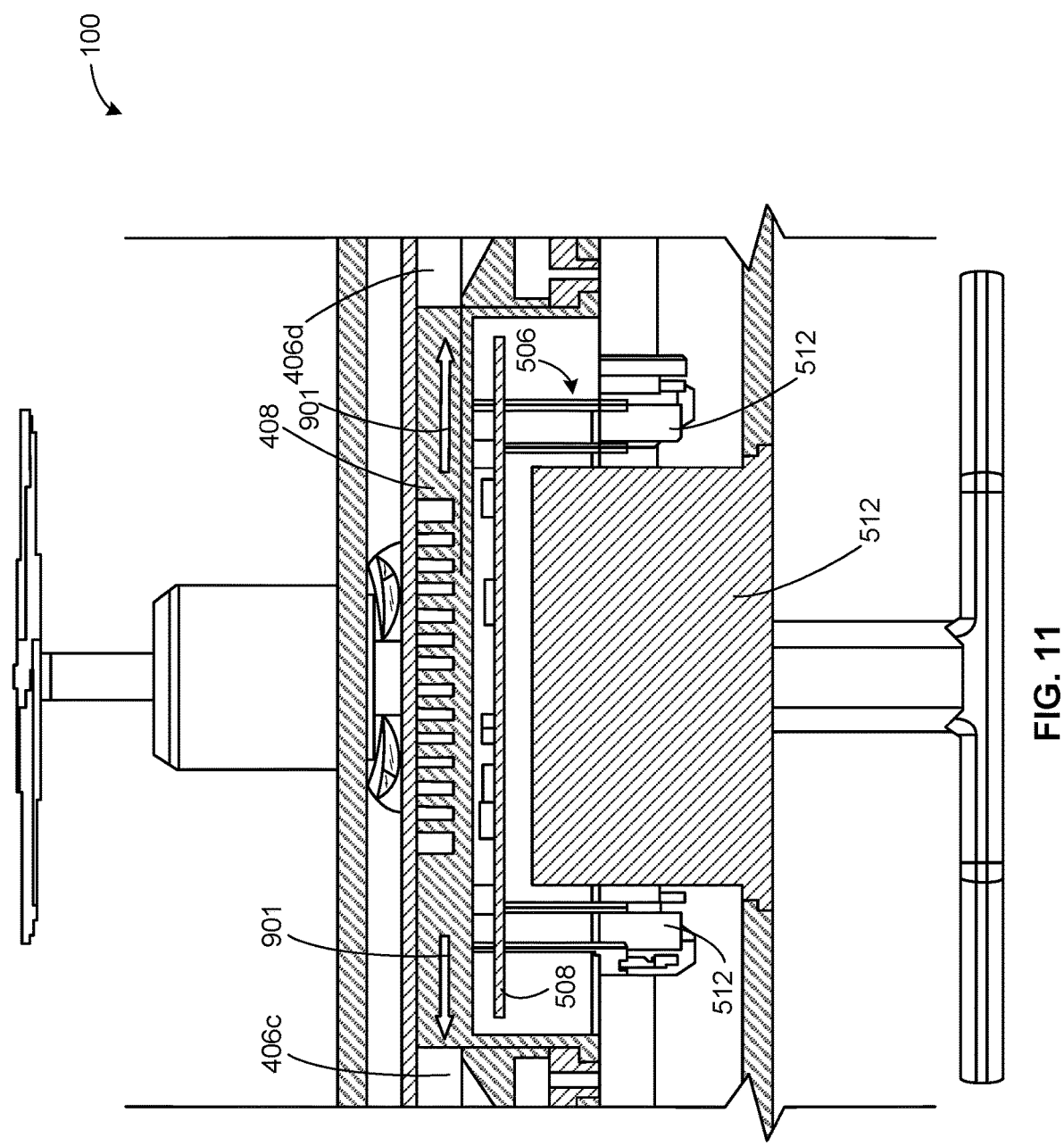

FIG. 11 is an enlarged view of a central portion of the example cross-section shown in FIG. 8B. In particular, FIG. 11 illustrated the third and fourth passageways 406c-d through which the fluid flows from the central portion 118 (e.g., the heatsink 408) toward the respective outlets 116a-b. In FIG. 11, the fluid flow is illustrated by arrows 901. For example, as the fluid flows across the heatsink 408, the fluid flows through the third and fourth passageways 406c-d and toward the first and second outlets 116a-b. Thus, the fluid flows into the third and fourth passageways 406c-d after the fluid has passed through the central portion 118 and/or passed across the heatsink 408. The profile of the third and fourth passageways 406c-d may improve and/or direct fluid flow toward the first and second outlets 116a-b.

FIG. 12A is an enlarged, partial cross-sectional view of the example first outlet 116a of FIG. 8B. FIG. 12B is an enlarged, partial cross-sectional view of the second outlet 116b of FIG. 8B. The propeller 702, the motor 704 and the third blower fan 410c of a third one of the rotor assemblies 104 is located or supported at the distal end of the third arm 108c. The propeller 702, the motor 704 and the fourth blower fan 410d of a fourth one of the rotor assemblies 104 is located at or supported by the distal end of the fourth arm 108d. As the motors 704 rotate the propellers 702 adjacent the first outlet 116a and the second outlet 116b, the motors 704 of the illustrated example also rotate the respective blower fans 410c-d to exhaust the fluid from the third and fourth passageways 406c-d via the first and second outlets 116a-b (e.g., after the fluid has passed through the central portion 118). In FIGS. 12A and 12B, the fluid flow is illustrated by arrows 901. To channel or direct the fluid in the third and fourth passageways 406c-d toward the respective blower fans 410c-d, the first ends 804c-d of the respective third and fourth passageways 410c-d channel the fluid around (e.g., above and below) the respective blower fans 410c-d.

The apertures 524c of the first duct plate 514 and the second duct plate 516 fluidly couple the first end 804c of the third passageway 406c and the blades of the third blower fan 410c. The apertures 524d of the first duct plate 514 and the second duct plate 516 fluidly couple the first end 804d of the fourth passageway 406d and the blades of the fourth blower fan 410d. In the illustrated example, the apertures 524c coaxially align with a rotational axis of the third blower fan 410c and the apertures 524d coaxially align with a rotational axis of the fourth blower fan 410d. The first outlet 116a and the second outlet 116b direct flow in a direction along a horizontal axis 1202 (e.g., parallel) of the third and fourth passageways 410c-d. The fluid exiting the first and second outlets 406a-b has a temperature that is greater than a temperature of the fluid entering the housing 106. For example, the temperature is greater than ambient temperature.

This dual operation of the blower fans 410a-d and the propellers 702 is advantageous because it ensures the blower fans 410a-d are always operating when the propellers 702 are being driven. If it is desired for the blower to operate when the propellers 702 are not driven, separate motors may be provided for the blower fans 410a-d and the propellers 702. As an example of such an approach is described below in connection with FIGS. 13, 14A, 14B, 15A, 15B and 16.

Figure 13:
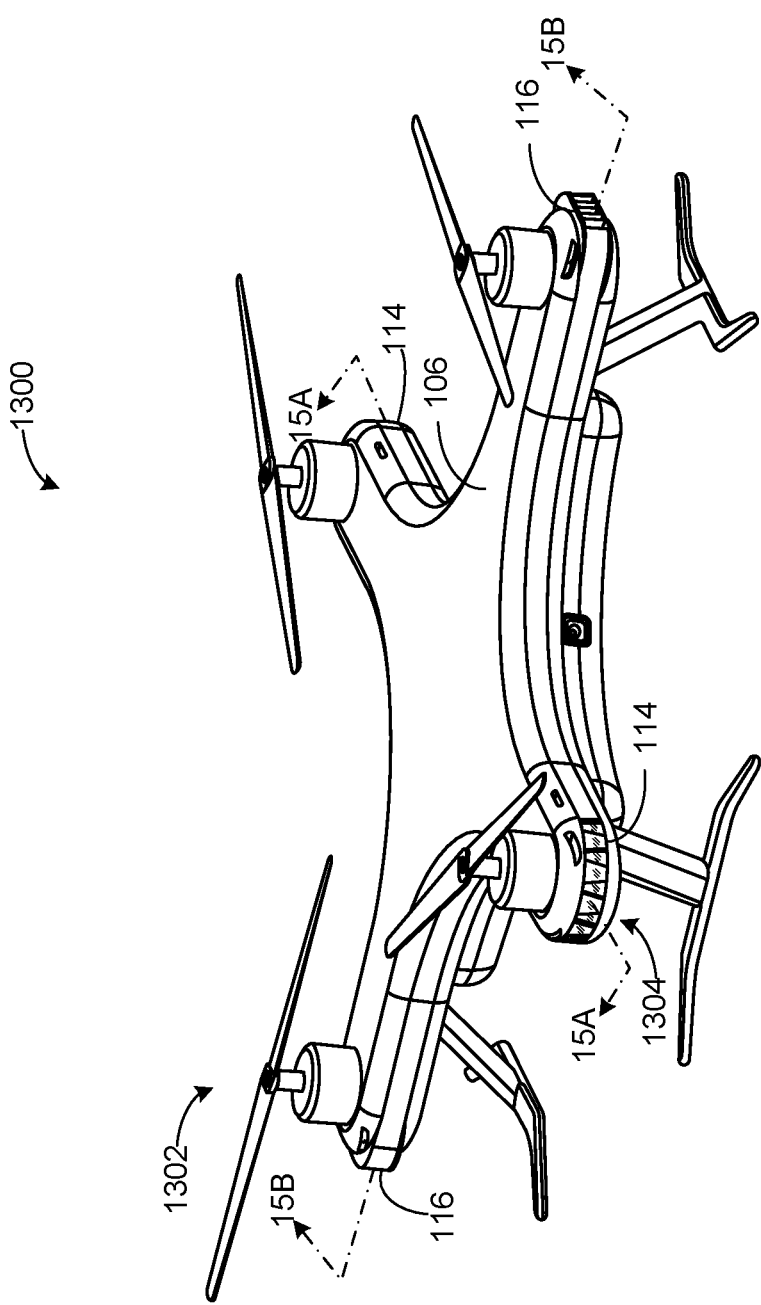
FIG. 13 is another example UAV disclosed herein.

FIG. 13 illustrates another example UAV 1300 disclosed herein. Those components of the example UAV 1300 that are substantially similar or identical to the components of the example UAV 100 described above with reference to FIGS. 1A-12 will not be described in detail again below. Instead, the interested reader is referred to the above corresponding descriptions. To facilitate this process, similar reference numbers will be used for like structures. For example, a housing 106 of the UAV 1300 of the illustrated example is substantially similar to the housing 106 of the UAV 100.

To generate lift, the UAV 1300 of the illustrated example includes a propulsion system 1302. Additionally, to dissipate heat from electrical components positioned in the housing 106 of the UAV 1300, the UAV 1300 of the illustrated example includes a thermal management system 1304. The thermal management system 1304 of the illustrated example includes one or more inlets 114 and one or more outlets 116 to channel fluid (e.g., air) through a flow path provided by the housing 106. Unlike the UAV 100, the propulsion system 1302 of the UAV 1300 of the illustrated example operates independently from the thermal management system 1304.

Figure 14A:
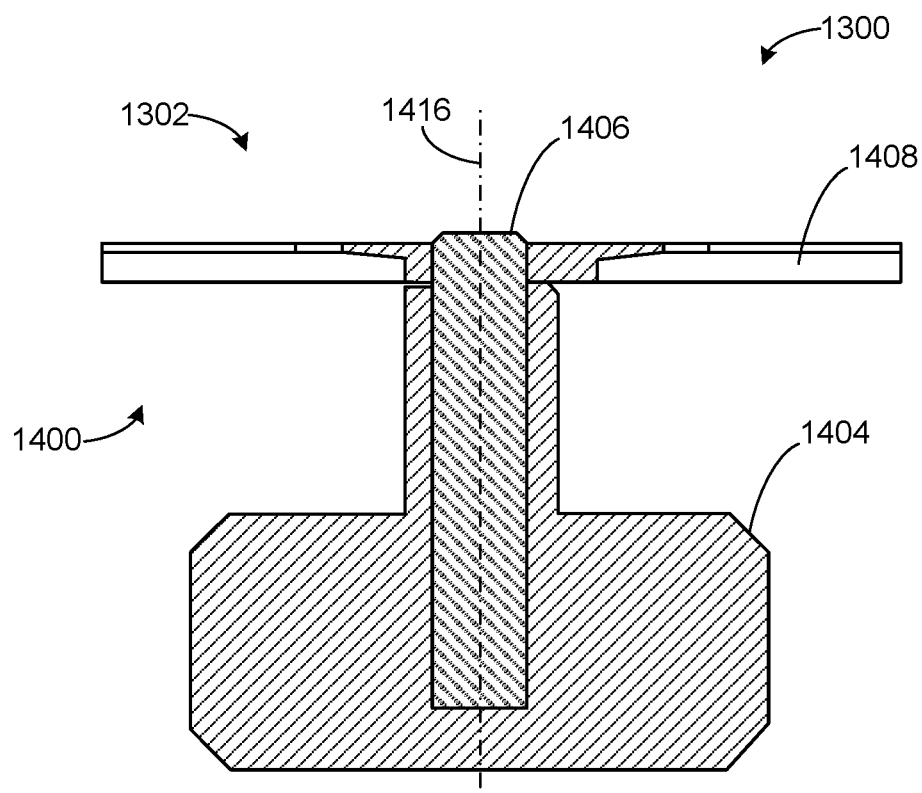
FIG. 14A is a cross-sectional view of an example rotor assembly of the example UAV of FIG. 13.
Figure 14B:
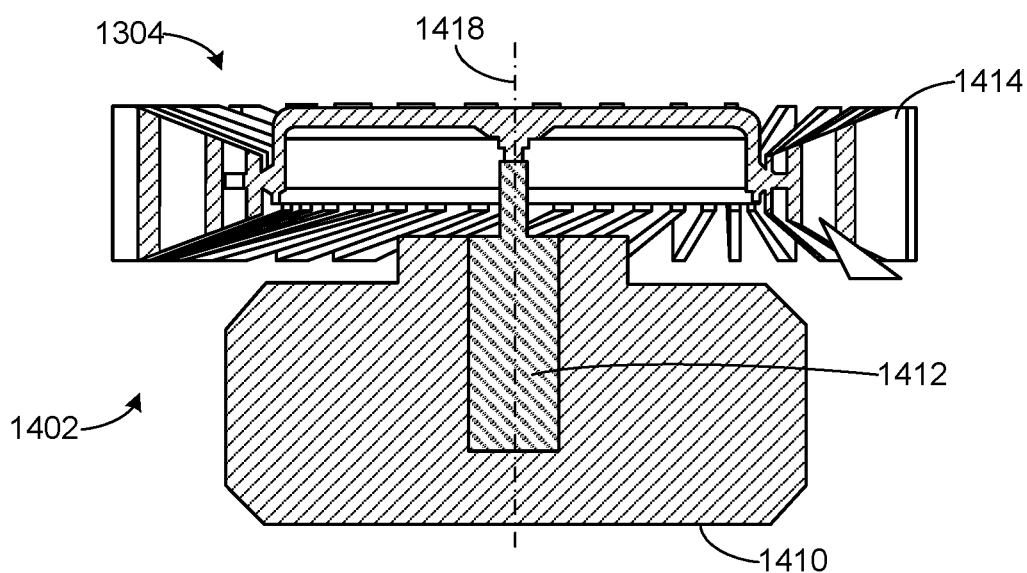
FIG. 14B is a cross-sectional view of an example blower assembly of the example UAV of FIG. 13.

FIG. 14A provides a cross-sectional view of an example implementation of a rotor assembly 1400 of the example propulsion system 1302 of FIG. 13. FIG. 14B provides a cross-sectional view of an example implementation of an example blower assembly 1402 of the example thermal management system 1304 of FIG. 13.

The rotor assembly 1400 of the illustrated example includes a motor 1404 having an output shaft 1406 to drive or rotate a propeller 1408. The blower assembly 1402 of the illustrated example includes a motor 1410 having a shaft 1412 to drive or rotate a blower fan 1414 of the thermal management system 1304.

In this example, the motor 1410 of the blower assembly 1402 operates independently from the motor 1404 operating the propeller 1408. Thus, in some instances during operation of the UAV 1300, a speed or angular velocity of the blower fan 1414 may be different than a speed or angular velocity of the propeller 1408. Moreover, the blower fan 1414 may operate even when the propeller 1408 is idle to provide cooling during non-areal activities (e.g., during charging, when at rest, etc.). Of course, the blower fan 1414 may additionally operate when the propeller 1408 is driven. Additionally, the rotor assembly 1400 (e.g., a longitudinal axis 1416 of the motor 1404) may be coaxially aligned with, or offset relative to, the blower assembly 1402 (e.g., a longitudinal axis 1418 of the motor 1410).

Figure 15A:
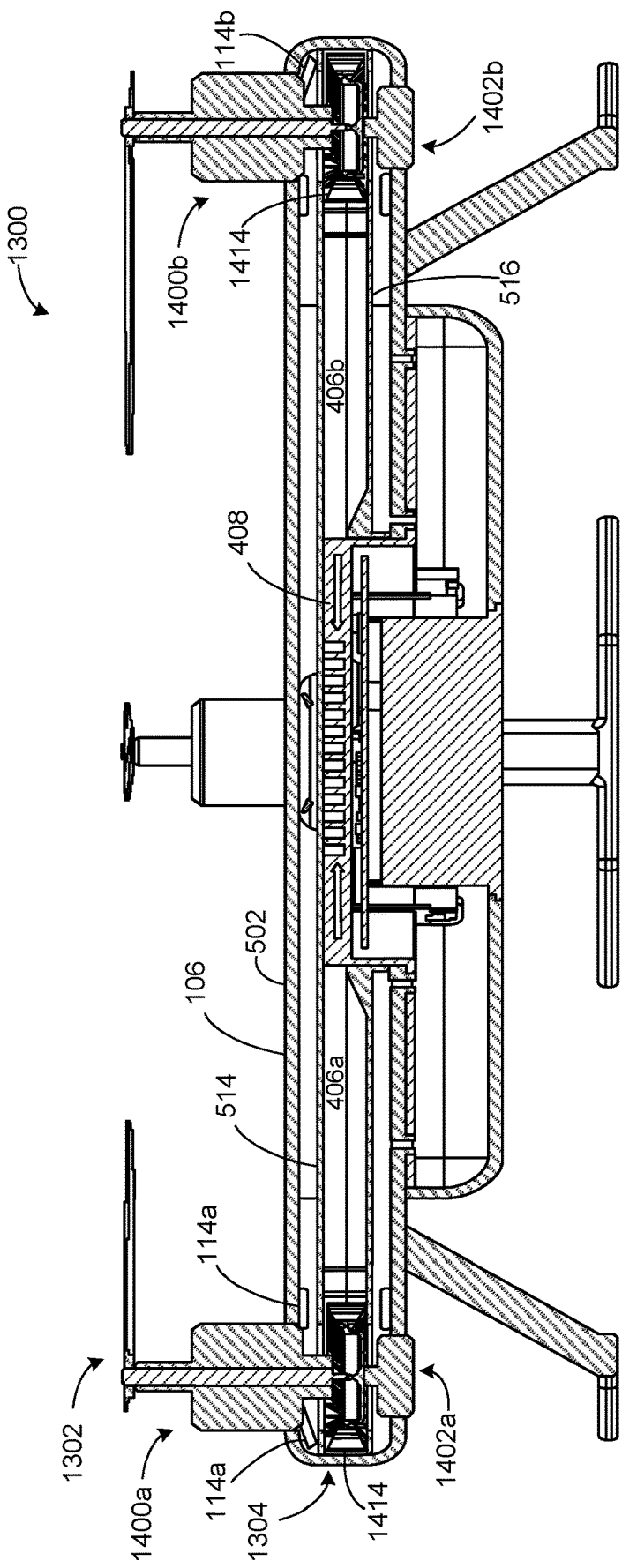
FIG. 15A is a cross-sectional view of the example UAV of FIG. 13 taken along line 15A-15A of FIG. 13.
Figure 15B:
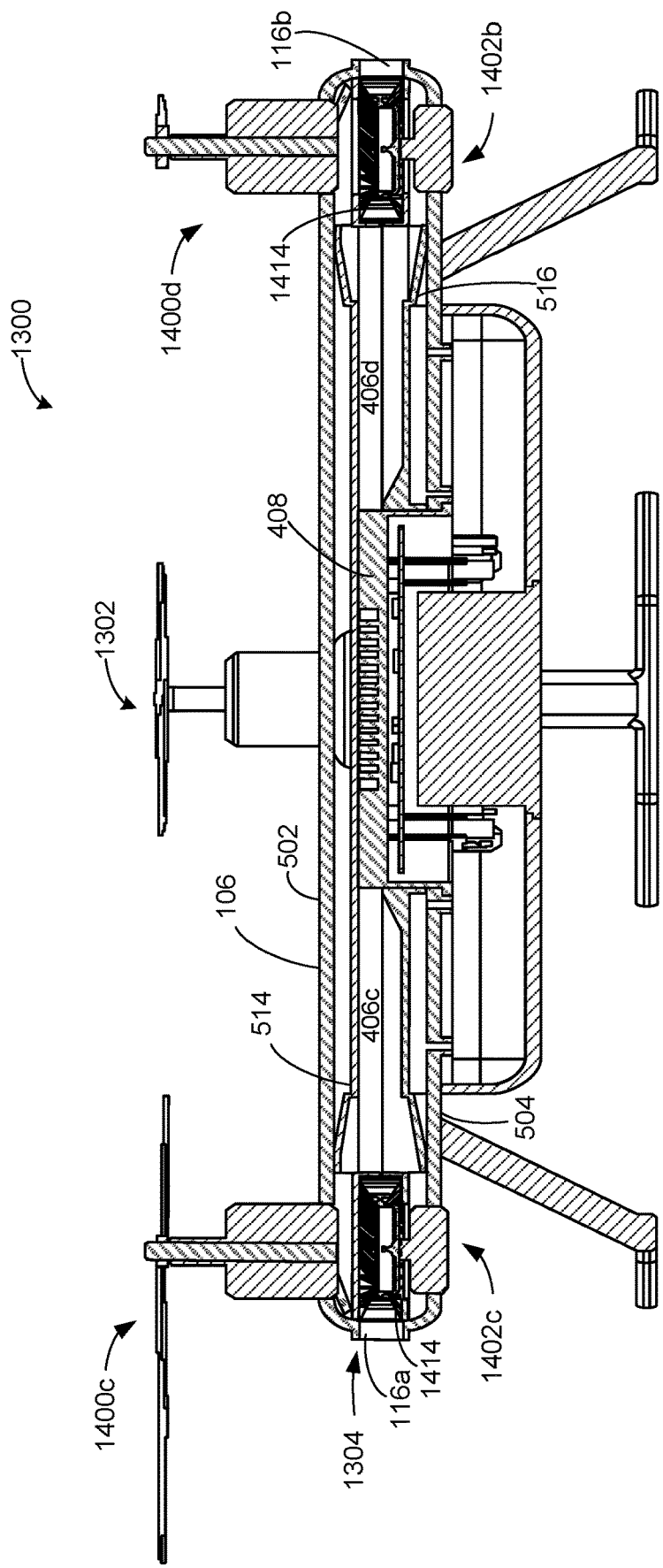
FIG. 15B is a cross-sectional view of the example UAV of FIG. 13 taken along line 15B-15B of FIG. 13.

FIG. 15A is a cross-sectional view of the example UAV 1300 of FIG. 13 taken along line 15A-15A of FIG. 13. FIG. 15B is a cross-sectional view of the example UAV 1300 of FIG. 13 taken along line 15B-15B of FIG. 13. The housing 106 of the UAV 1300 supports the rotor assembly 1400 and the blower assembly 1402.

For example, a first rotor assembly 1400a and a first blower assembly 1402a are positioned adjacent a first inlet 114a of the housing 106. The first cover 502 of the housing 106 supports the first rotor assembly 1400a and a second cover 504 of the example housing 106 supports the first blower assembly 1402a. A second rotor assembly 1400b and a second blower assembly 1402b are positioned adjacent a second inlet 114b and supported by the first cover 502 and the second cover 504, respectively. Likewise, a third rotor assembly 1400c and a third blower assembly 1402c are supported by the first cover 502 and the second cover 504, respectively, and positioned adjacent a first outlet 116a. A fourth rotor assembly 1400d and a fourth blower assembly 1402d are supported by the first cover 502 and the second cover 504, respectively, and positioned adjacent a second outlet 116b.

The thermal management system 1304 of the illustrated example operates substantially similar to the thermal management system 112 disclosed above, except it is not tied to operation of the propellers. It may operate when the propellers are driven and/or when the propellers are idle. For example, the blower fans 1414 operate to blow fluid (e.g. air) from the inlets 114a-b, across a heatsink 408, and towards the outlets 116a-b via a fluid flow path 406 formed by the first duct plate 514 and the second duct plate 516 positioned between the first cover 502 and the second cover 504.

Figure 16:
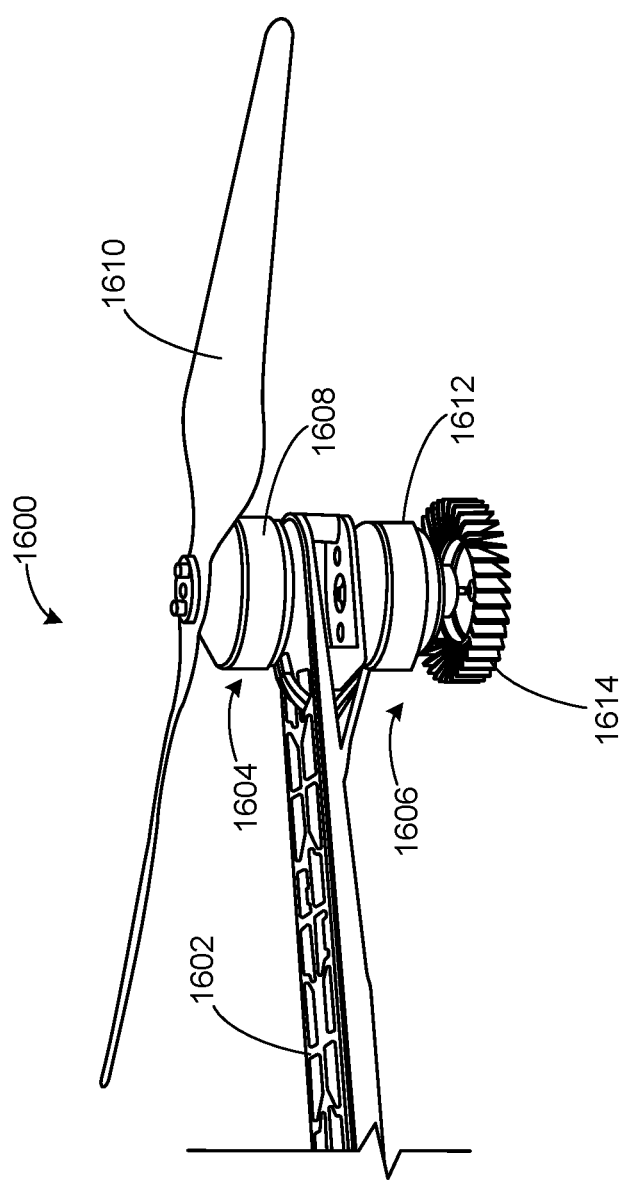
FIG. 16 illustrates a frame of another example UAV disclosed herein.

FIG. 16 illustrates an alternate example boom 1600 for a UAV disclosed herein. The boom 1600 of the illustrated example may be positioned in, for example, the housing 106 of the UAV 100 of FIGS. 1A-12 or in the housing 106 of the UAV 1300 of FIGS. 13-15B. The boom 1600 of the illustrated example of FIG. 16 is a structure for supporting both a rotor assembly 1604 and a blower assembly 1606. The rotor assembly 1604 of the illustrated example includes a first motor 1608 to drive a propeller 1610 and the blower assembly 1606 includes a second motor 1612 to drive a blower fan 1614. In this example, the first motor 1608 is positioned on top of a distal end of the boom 1600 and the second motor 1612 is positioned beneath the distal end of the boom 1600. The distal end of the boom 1600 is located radially outward from the central area (e.g., the central portion 118) of the UAV. In some examples, a boom such as the example boom 1600 is positioned or located within (e.g., at least partially encapsulated inside of) each one of the arms 108a-d of the housing 106. Additionally, the boom 1600 of the illustrated example supports a duct (e.g., the duct 407, the first duct plate 514, the second duct plate 516, etc.) within the housing 106 such that a first end of the duct is positioned adjacent the blower fan 1614 and a second end of the duct is positioned adjacent the central portion 118 of the housing 106. In some examples, the boom 1600 may support a duct defining one of the respective fluid passageways 406a-d. In some examples, the boom 1600 is captured within the duct.

Example unmanned aerial vehicles are disclosed. Further examples and combinations thereof include the following.

Example 1 may be a housing for an unmanned aerial vehicle including a central portion defining a cavity; a first arm to support a first propeller, the first arm having a first proximal end coupled to the central portion and a first distal end spaced from the central portion, the first distal end defining an inlet, the first arm defining a first fluid path in communication with the inlet and the central cavity; and a second arm to support a second propeller, the second arm having a second proximal end coupled to the central portion and a second distal end spaced from the central portion, the second distal end defining an outlet, the second arm defining a second fluid path in communication with the outlet and the central cavity, the inlet and outlet in fluid communication via the first path, the central cavity and the second path Example 2 includes the housing of example 1, further including a first blower located at the first distal end of the first arm, the first blower to draw fluid from an exterior of the housing, through the inlet and into the first fluid path; and a second blower located at the second distal end, the second blower to direct fluid from the second fluid path, through the outlet to the exterior of the housing.

Example 3 includes the housing of examples 1-2, further including a first motor to drive the first blower and a second motor to drive the second blower.

Example 4 includes the housing of examples 1-3, further including a first propeller located at the first distal end and a second propeller located at the second distal end.

Example 5 includes the housing of examples 1-4, wherein the first motor is to drive the first propeller and the second motor is to drive the second propeller.

Example 6 includes the housing of examples 1-5, further including a third motor to drive the first propeller and a fourth motor to drive the second propeller, the first and second motors to operate independently from the third and fourth motors.

Example 7 includes the housing of examples 1-6, further including a first boom disposed within the first arm to support the first motor.

Example 8 includes the housing of examples 1-7, further including a heatsink located adjacent the central portion, the heatsink being at least partially positioned to contact fluid flowing through the central cavity from the inlet to the outlet.

Example 9 includes the housing of examples 1-8, further including an electrical component positioned adjacent the heatsink.

Example 10 includes the housing of examples 1-9, wherein the first fluid path has different cross-sectional profiles at different locations between the inlet and the central cavity to effect a fluid flow characteristic within the first fluid path.

Example 11 includes the housing of examples 1-10, wherein the second fluid path has different cross-sectional profiles at different locations between the central cavity and the outlet to effect a fluid flow characteristic within the second fluid path Example 12 includes the housing of examples 1-11, wherein the first fluid path exhibits a converging path from the inlet towards the central portion.

Example 13 includes the housing of examples 1-12, wherein the second fluid path exhibits a diverging path from the central portion towards the outlet.

Example 14 includes the housing of examples 1-13, further including a duct plate positioned in the housing.

Example 15 includes the housing of examples 1-14, wherein the duct plate is a first duct plate, and further including a second duct plate cooperating with the first duct plate to at least partially define at least one of the first fluid path and the second fluid path.

Example 16 includes the housing of examples 1-15, wherein at least one of the first duct plate and the second duct plate define an elevated surface in the first fluid path adjacent the central portion to reduce a cross-sectional area of the first fluid path adjacent the central portion.

Example 17 includes the housing of examples 1-16, wherein at least one of the first duct plate and the second duct plate include a tapered end adjacent the outlet to increase a cross-sectional area of the second fluid path adjacent the outlet.

Example 18 includes the housing of examples 1-17, wherein the first duct plate and the second duct plate define a diffusor adjacent the outlet.

Example 19 includes the housing of examples 1-18, wherein the inlet is a first inlet, the outlet is a first outlet, and the housing further includes a third arm and a fourth arm, the third arm to fluidly couple the central cavity to a second inlet provided by the third arm and the fourth arm to fluidly couple the central cavity to a second outlet provided by the fourth arm.

Example 20 includes the housing of examples 1-19, further including a third blower located adjacent the second inlet, the third blower to direct fluid toward the central cavity via the second inlet.

Example 21 includes the housing of examples 1-20, further including a fourth blower located adjacent the second outlet to draw fluid from the central portion toward the second outlet.

Example 22 includes an unmanned aerial vehicle including a plurality of propellers; a plurality of blowers; a plurality of motors; an electrical component to control operation of the motors; a housing including: a central portion defining a cavity; a first arm having a first distal end and a first proximal end coupled to the central portion, the first arm defining a first fluid path in communication with a first inlet at the first distal end and with the central cavity, the first distal end supporting a first one of the propellers, a first one of the blowers and a first one of the motors; a second arm having a second distal end and a second proximal end coupled to the central portion, the second arm defining a second fluid path in communication with a first outlet at the second distal end and with the central cavity, the second distal end supporting a second one of the propellers, a second one of the blowers and a second one of the motors; a third arm having a third distal end and a third proximal end coupled to the central portion, the third arm defining a third fluid path in communication with a second inlet at the third distal end and with the central cavity, the third distal end supporting a third one of the propellers, a third one of the blowers and a third one of the motors; and a fourth arm having a fourth distal end and a fourth proximal end coupled to the central portion, the fourth arm defining a fourth fluid path in communication with a second outlet at the fourth distal end and with the central cavity, the fourth distal end supporting a fourth one of the propellers, a fourth one of the blowers and a fourth one of the motors.

Example 23 includes the unmanned aerial vehicle of example 22, wherein the housing has an X-shaped profile.

Example 24 includes the unmanned aerial vehicle of examples 22-23, wherein the first and third blowers are to draw air from the atmosphere into the housing and the second and fourth blowers are to exhaust the air to the atmosphere after the air has passed through the central cavity.

Example 25 includes the unmanned aerial vehicle of examples 22-24, wherein the first blower is located on a diametrically opposite side of the central cavity from the second blower.

Example 26 includes the unmanned aerial vehicle of examples 22-25, wherein the third blower is located on a diametrically opposite side of the central cavity from the fourth blower.

Example 27 includes the unmanned aerial vehicle of examples 22-26, wherein the first motor is to drive the first blower and the first propeller at a same time.

Example 28 includes the unmanned aerial vehicle of examples 22-27, wherein the first, second, third and fourth arms include ducts defined by a first duct plate and a second duct plate positioned in the housing.

Example 29 includes the unmanned aerial vehicle of examples 22-28, wherein the housing includes a first cover coupled to a second cover.

Example 30 includes the unmanned aerial vehicle of examples 22-29, wherein the first fluid path and the second fluid path provide a converging profile from the respective first and second inlets towards the central cavity, and the second fluid path provides a diverging profile from the central cavity towards the respective first and second outlets.

Example 31 includes an unmanned aerial vehicle including an X-shaped housing having first, second, third and fourth arms; means for providing lift to the housing, the lift means located at respective ones of the first, second, third and fourth arms; means for generating airflow through the housing from distal ends of the first and second arms to distal ends of the third and fourth arms, the generating means located at respective ones of the first, second, third and fourth arms; and means for driving at least one of the airflow generating means and the lift means.

Example 32 includes the unmanned aerial vehicle of example 31, further including a processor to control operation of at least one of the driving means, the lift means and the generating means.

Example 33 includes the unmanned aerial vehicle of examples 31-32, wherein the driving means is to simultaneously drive the lift means and the airflow generating means.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An unmanned aerial vehicle comprising:
a central portion defining a cavity;
a first arm to support a first propeller, the first arm having a first proximal end coupled to the central portion and a first distal end spaced from the central portion, the first distal end defining an inlet, the first arm defining a first fluid path in communication with the inlet and the central cavity;
a second arm to support a second propeller, the second arm having a second proximal end coupled to the central portion and a second distal end spaced from the central portion, the second distal end defining an outlet, the second arm defining a second fluid path in communication with the outlet and the central cavity, the inlet and outlet in fluid communication via the first path, the central cavity and the second path;
a first blower at the first distal end of the first arm, the first blower to draw fluid from an exterior of the housing, through the inlet and into the first fluid path; and
a second blower at the second distal end, the second blower to direct fluid from the second fluid path, through the outlet to the exterior of the housing.

2. The unmanned aerial vehicle of claim 1, further including a first motor to drive the first blower and a second motor to drive the second blower.

3. The unmanned aerial vehicle of claim 2, further including a first propeller at the first distal end and a second propeller at the second distal end, wherein the first motor is to drive the first propeller and the second motor is to drive the second propeller.

4. The unmanned aerial vehicle of claim 2, further including a first propeller at the first distal end and a second propeller at the second distal end, and further including a third motor to drive the first propeller and a fourth motor to drive the second propeller, the first and second motors to operate independently from the third and fourth motors.

5. The unmanned aerial vehicle of claim 1, further including a heatsink adjacent the central portion, the heatsink to at least partially contact fluid flowing through the central cavity from the inlet to the outlet, wherein the heatsink is adjacent an electrical component of the vehicle.

6. The unmanned aerial vehicle of claim 1, wherein the first fluid path has different cross-sectional profiles at different locations between the inlet and the central cavity to effect a fluid flow characteristic within the first fluid path.

7. The unmanned aerial vehicle of claim 1, wherein the second fluid path has different cross-sectional profiles at different locations between the central cavity and the outlet to effect a fluid flow characteristic within the second fluid path.

8. The unmanned aerial vehicle of claim 1, wherein the first fluid path exhibits a converging path from the inlet towards the central portion, and wherein the second fluid path exhibits a diverging path from the central portion towards the outlet.

9. The unmanned aerial vehicle of claim 1, wherein the inlet is a first inlet, the outlet is a first outlet, and the housing further includes a third arm and a fourth arm, the third arm to fluidly couple the central cavity to a second inlet provided by the third arm and the fourth arm to fluidly couple the central cavity to a second outlet provided by the fourth arm.

10. The unmanned aerial vehicle of claim 9, further including a third blower adjacent the second inlet, the third blower to direct fluid toward the central cavity via the second inlet, a fourth blower adjacent the second outlet to draw fluid from the central portion toward the second outlet.

11. A housing for an unmanned aerial vehicle, the housing comprising:
   a central portion defining a cavity;
   a first arm to support a first propeller, the first arm having a first proximal end coupled to the central portion and a first distal end spaced from the central portion, the first distal end defining an inlet, the first arm defining a first fluid path in communication with the inlet and the central cavity;
   a second arm to support a second propeller, the second arm having a second proximal end coupled to the central portion and a second distal end spaced from the central portion, the second distal end defining an outlet, the second arm defining a second fluid path in communication with the outlet and the central cavity, the inlet and outlet in fluid communication via the first path, the central cavity and the second path; and
   a first duct plate and a second duct plate in the housing, the second duct plate cooperating with the first duct plate to at least partially define at least one of the first fluid path or the second fluid path.

12. The housing of claim 11, wherein at least one of the first duct plate and the second duct plate define an elevated surface in the first fluid path adjacent the central portion to reduce a cross-sectional area of the first fluid path adjacent the central portion, wherein at least one of the first duct plate and the second duct plate include a tapered end adjacent the outlet to increase a cross-sectional area of the second fluid path adjacent the outlet.

13. The housing of claim 11, wherein the first duct plate and the second duct plate define a diffusor adjacent the outlet.

14. An unmanned aerial vehicle comprising:
   a plurality of propellers;
   a plurality of blowers;
   a plurality of motors;
   an electrical component to control operation of the motors;
   a housing including:
      a central portion defining a cavity;
      a first arm having a first distal end and a first proximal end coupled to the central portion, the first arm defining a first fluid path in communication with a first inlet at the first distal end and with the central cavity, the first distal end supporting a first one of the propellers, a first one of the blowers and a first one of the motors;
      a second arm having a second distal end and a second proximal end coupled to the central portion, the second arm defining a second fluid path in communication with a first outlet at the second distal end and with the central cavity, the second distal end supporting a second one of the propellers, a second one of the blowers and a second one of the motors;
      a third arm having a third distal end and a third proximal end coupled to the central portion, the third arm defining a third fluid path in communication with a second inlet at the third distal end and with the central cavity, the third distal end supporting a third one of the propellers, a third one of the blowers and a third one of the motors; and
      a fourth arm having a fourth distal end and a fourth proximal end coupled to the central portion, the fourth arm defining a fourth fluid path in communication with a second outlet at the fourth distal end and with the central cavity, the fourth distal end supporting a fourth one of the propellers, a fourth one of the blowers and a fourth one of the motors.

15. The vehicle of claim 14, wherein the housing has an X-shaped profile.

16. The vehicle of claim 14, wherein the first and third blowers are to draw air from the atmosphere into the housing and the second and fourth blowers are to exhaust the air to the atmosphere after the air has passed through the central cavity.

17. The vehicle of claim 14, wherein the first blower is located on a diametrically opposite side of the central cavity from the second blower, and wherein the third blower is located on a diametrically opposite side of the central cavity from the fourth blower.

18. The vehicle of claim 14, wherein the first motor is to drive the first blower and the first propeller at a same time.

19. The vehicle of claim 14, wherein the first, second, third and fourth arms include ducts defined by a first duct plate and a second duct plate positioned in the housing.

20. The vehicle of claim 14, wherein the first fluid path and the second fluid path provide a converging profile from the respective first and second inlets towards the central cavity, and the second fluid path provides a diverging profile from the central cavity towards the respective first and second outlets.

21. An unmanned aerial vehicle, the vehicle comprising:
   an X-shaped housing having first, second, third and fourth arms;

means for providing lift to the housing, the lift means located at respective ones of the first, second, third and fourth arms;

means for generating airflow through the housing from distal ends of the first and second arms to distal ends of the third and fourth arms, the generating means located at respective ones of the first, second, third and fourth arms; and means for driving at least one of the airflow generating means and the lift means.

22. The housing of claim 21, further including a processor to control operation of at least one of the driving means, the lift means and the generating means.

23. The housing of claim 21, wherein the driving means is to simultaneously drive the lift means and the airflow generating means.

* * * * *